United States Patent [19]
Vorhaus et al.

[11] Patent Number: 4,599,585
[45] Date of Patent: Jul. 8, 1986

[54] N-BIT DIGITALLY CONTROLLED PHASE SHIFTER

[75] Inventors: James L. Vorhaus, Newton; Robert W. Bierig, Hopkinton; Robert A. Pucel, Needham, all of Mass.

[73] Assignee: Raytheon Company, Lexington, Mass.

[21] Appl. No.: 602,269

[22] Filed: Apr. 23, 1984

Related U.S. Application Data

[63] Continuation of Ser. No. 353,117, Mar. 1, 1982, abandoned.

[51] Int. Cl.⁴ .......................... H03H 7/18; H01P 1/18

[52] U.S. Cl. .................................... 333/164; 333/139; 333/156; 333/160; 333/161

[58] Field of Search ............................... 333/156–164, 333/138–140, 116; 29/600, 602 R

[56] References Cited

U.S. PATENT DOCUMENTS

| | | | |
|---|---|---|---|
| 3,516,024 | 6/1970 | Lange | 333/116 |
| 3,750,055 | 7/1973 | Funck | 357/40 X |
| 3,781,722 | 12/1973 | Pierson | 333/156 |
| 4,056,792 | 11/1977 | Horwitz et al. | 333/156 |
| 4,161,705 | 7/1979 | Nemit et al. | 333/164 X |
| 4,297,641 | 10/1981 | Sterzer | 333/139 X |
| 4,313,126 | 1/1982 | Krumm et al. | 357/41 X |
| 4,389,660 | 6/1983 | Decker | 357/41 |

*Primary Examiner*—Marvin L. Nussbaum
*Attorney, Agent, or Firm*—Denis G. Maloney; Richard M. Sharkansky

[57] ABSTRACT

A n-bit digitally controlled phase shifter for controlling the phase of an applied signal over the range of 0° to 360° includes n, cascade interconnected phase shifter stages. Each phase shifter stage is formed on a semi-insulating substrate having a pair of field effect transistors and a pair of transmission lines formed thereon. Each field effect transistor (FET), includes a pair of gate electrodes, a drain electrode, and a source electrode, connected in a common (grounded) source configuration. Each transmission line is coupled between a corresponding one of the drain electrodes and a common output port. The lengths of the transmission lines are selected to provide two paths having an electrical pathlength corresponding to a phase shift of $\phi_1$ or a phase shift of $\phi_1+\Delta\phi_1$ where $\Delta\phi_i$ is the phase shift increment of the $i^{th}$ stage. A first one of the gate electrodes of each field effect transistor is fed by the applied signal. A pair of control signals representative of one of the bits, and its compliment, is fed to the second gate electrodes of the field effect transistors, and is used to selectively couple the applied signal to one of the drain electrodes of such field effect transistors. The phase of the applied signal is shifted by propagation through the transmission line selected through control signals. Each one of the n stages, has a predetermined electrical pathlength difference for providing a selected phase shift increment ($\Delta\phi_i$).

24 Claims, 25 Drawing Figures

FIG. 16
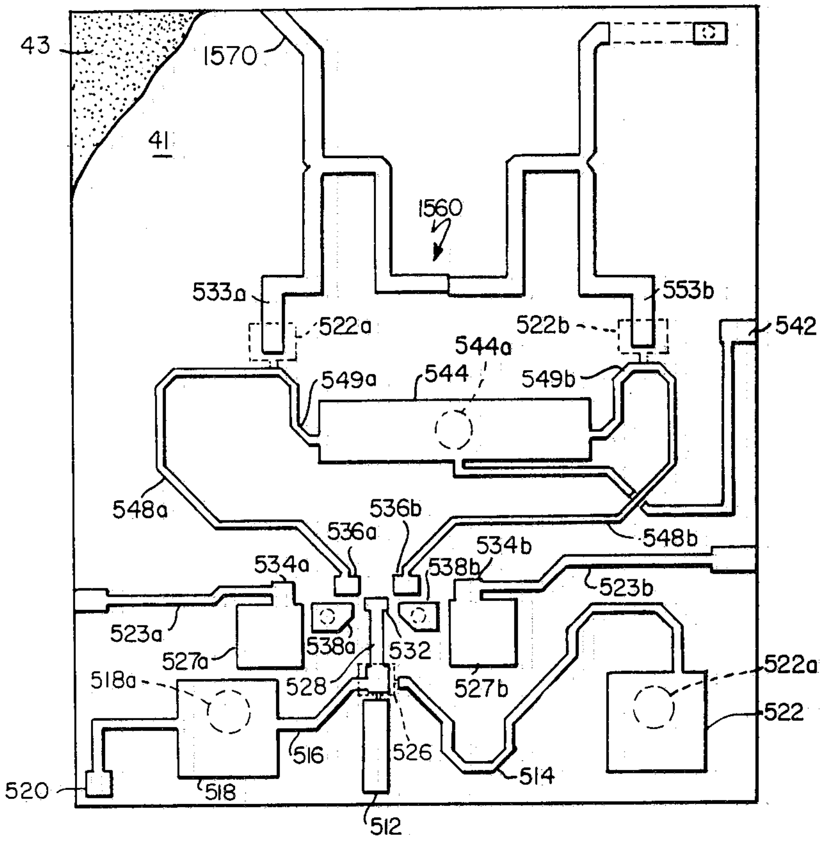
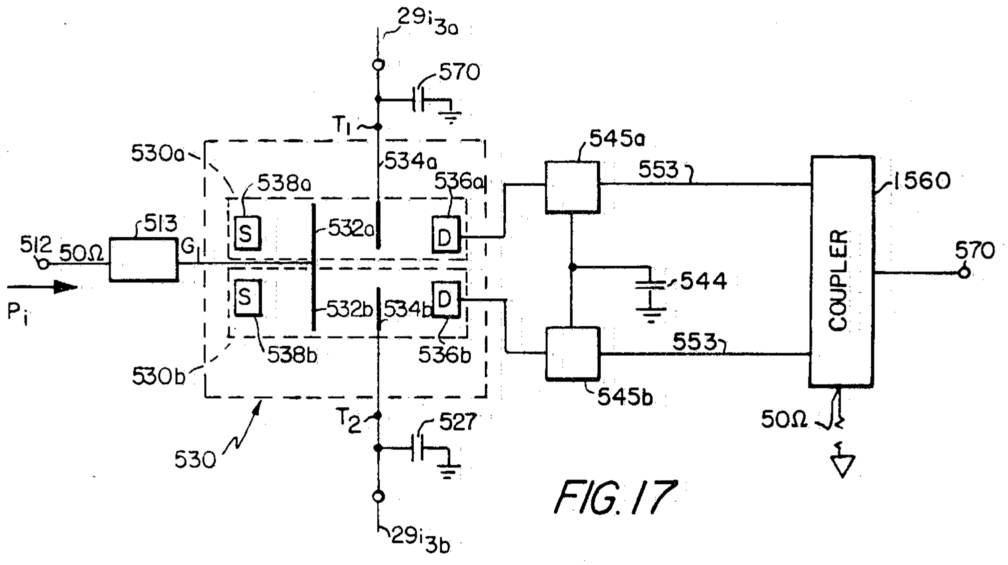
FIG. 17

N-BIT DIGITALLY CONTROLLED PHASE SHIFTER

The Government has rights in this invention pursuant to Contract No. E33615-79-C-1923 awarded by the U.S. Air Force.

This application is a continuation of application Ser. No. 353,117 filed Mar. 1, 1982, now abandoned.

BACKGROUND OF THE INVENTION

This invention relates to microwave frequency circuits and more particularly to a phase shifter circuit for varying the phase of an applied signal.

As is known in the art a phase shifter is often employed, for example, in phased array antenna systems to control the phase of a microwave frequency signal used to generate a portion of a desired radiation pattern. One technique for realizing a phase shifter, the so called ferrite phase shifter, includes a bar of ferromagnetic material disposed coaxially within a section of waveguide. A solenoid is formed around the waveguide and when energized with an electric current produces a magnetic field. The magnetic field causes variations in the permability of the bar resulting in a variation in the propagation constant of the microwave frequency energy. The resulting variation in the propagation constant produces a phase shift of an applied microwave frequency signal. The ferrite phase shifter, in addition, requires driver circuits to control the electric current which produces the magnetic field. Another technique for realizing a phase shifter employs p-i-n diode switches. The switched line p-i-n diode phase shifter, includes two single pole double throw (SPDT) p-i-n diode switches for each bit and two line lengths coupled between each SPDT switch.

The prior art approaches, as exemplified above, in general employ passive techniques to provide the desired phase shift. These approaches have several disadvantages including: microwave frequency signal loss due to dissipation of the signal in the passive element of the phase shifter; and a relatively large switching power is required to switch the passive elements that provide the desired phase shift. Further, the above approaches, particularly the ferromagnetic approaches, have relatively long switching times, typically in the order of hundreds of microseconds. Such long switching times are undersirable for fast scanning of the array. Moreover, the above approaches are difficult to realize using monolithic microwave integrated circuit techniques.

SUMMARY OF THE INVENTION

In accordance with the present invention, a phase shifter formed on a substrate includes a plurality of transistors formed thereon, each transistor having a pair of control electrodes, an output electrode and a reference electrode. In the preferred embodiment a field effect transistor (FET) having a pair of gate electrodes, a drain electrode and a source electrode is utilized. Each of the plurality of FET's is connected in a common (grounded) source configuration. One of the gate electrodes of each of the plurality of FET's is coupled to a common signal input. The second gate electrodes of the plurality of FET's are fed by control signals used to control the conduction of the respective FET's. A plurality of transmission lines formed on the substrate, are electrically coupled between a corresponding one of the drain electrodes and a common port. The respective lengths of each transmission line section between the drain electrodes and their connection to the common junction, are selected to provide an electrical pathlength difference corresponding to a selected phase shift increment ($\Delta\phi$). With such an arrangement, a digitally controlled phase shifter is fabricated as a monolithic microwave integrated circuit resulting in lower cost, lower power consumption, improved reliability and reproducibility, and, by using an active device such as a FET, a phase shifter having a substantial amount of gain and high switching speeds. In addition, phase shift circuits realized as monolithic microwave integrated circuits in accordance with the invention result in modular circuits, where varying the phase of an applied signal, changes only the phase shift of the signal without substantially affecting the gain or VSWR of the phase shifter.

BRIEF DESCRIPTION OF THE DRAWINGS

For a better understanding of this invention, reference is made in the following more detailed description to the drawings wherein:

FIG. 16 is a plan view of the variable phase shifter shown in FIG. 15;

FIG. 17 is a block diagram of one stage of the n-bit variable phase shifter shown in FIG. 16;

DESCRIPTION OF THE PREFERRED EMBODIMENT

Figure 1:
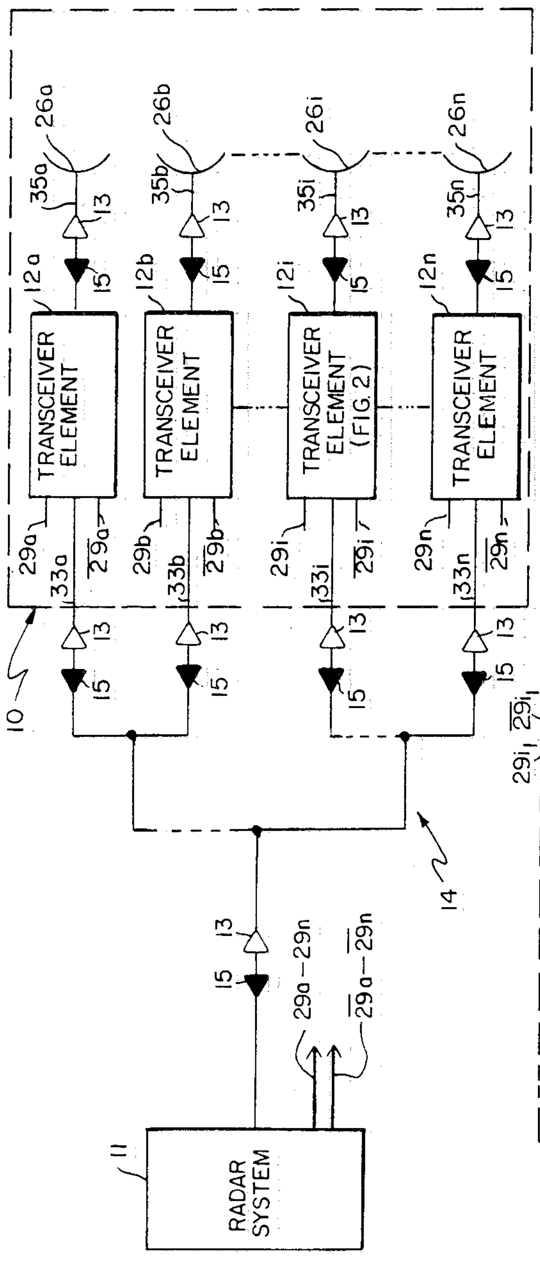
FIG. 1 is an overall block diagram of a radar system coupled to a phased array antenna system through a plurality of transceiver elements.

Referring now to FIG. 1, a phased array antenna 10 is coupled to a radar system 11 by a feed network 14, as shown. The phased array antenna 10 includes a plurality of, here n, identical transmitter/receiver (transceiver) elements 12a–12n, coupled to a like plurality of corresponding antenna elements 26a–26n, as shown. The feed network 14, here a parallel feed network, provides a signal path for a microwave signal passing from the radar system 11 to the phased array antenna 10 for transmission to a target (not shown), and a signal path for reception of echo signals from the target (not shown) to the radar system 11. A plurality of control buses 29a–29n, $\overline{29a}$–$\overline{29n}$ are provided from the radar system 11. Signals on such buses 29a–29n, $\overline{29a}$–$\overline{29n}$ are used to control the transceiver elements 12a–12n of the phase array antenna 10. The microwave signal from the feed network 14 is coupled to each of the transceiver elements 12a–12n, as indicated by the open arrows 13. The portion of microwave signal coupled to each one of the transceiver elements 12a–12n is then coupled to the corresponding one of the antenna elements 26a–26n. Similarly, a portion of the microwave echo signal from the target is coupled to each of the antenna elements 26a–26n, the corresponding transceiver elements 12a–12n, and the feed network 14 as indicated by solid arrows 15, for processing by the radar system 11. The control signals on buses 29a–29n, $\overline{29a}$–$\overline{29n}$ during the transmit mode allow the transceiver elements 26a–26n to produce collimated and directed beams of transmitted microwave energy and control signals on such buses during the receive mode allow such transceiver elements 26a–26n to produce collimated and directed beams of received microwave energy.

Figure 2:
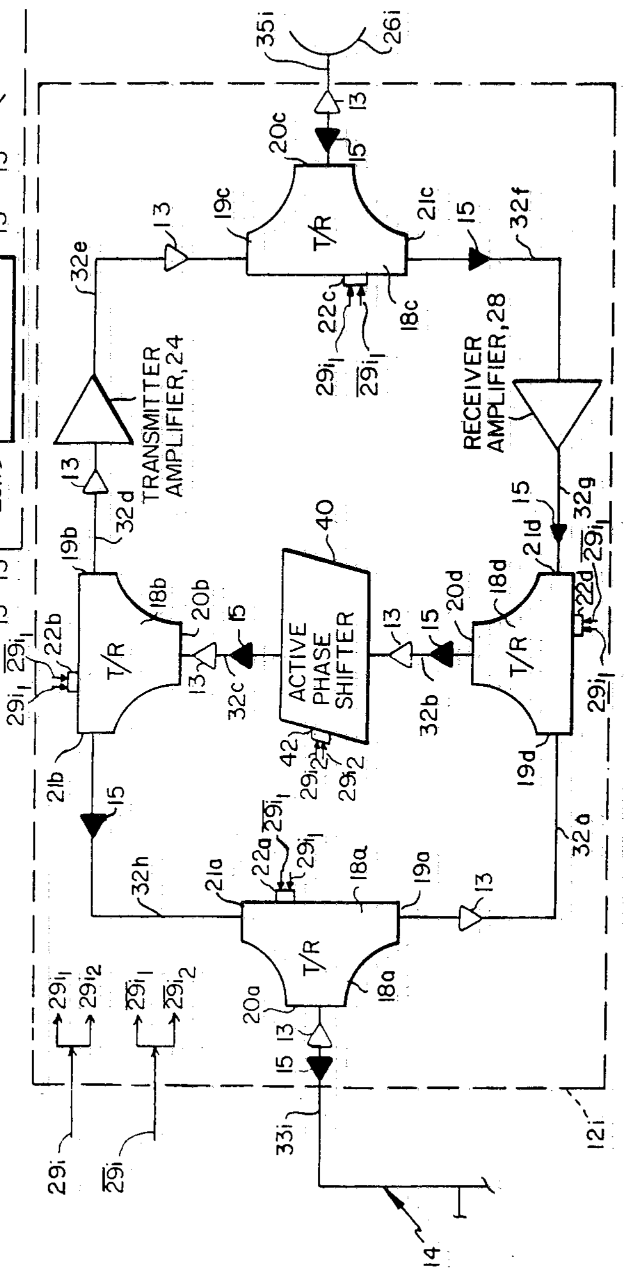
FIG. 2 is a block diagram of one of the plurality of transceiver elements shown in FIG. 1.

Referring now to FIG. 2, a representative one of the transceiver elements 12a–12n, here transceiver element 12i is shown coupled, via a transmission line 33i, to a portion of the feed network 14 and to an antenna element 26i, via a transmission line 35i, as shown. Transceiver element 12i here includes 50 ohm transmission lines 32a to 32h, four transmitter/receiver (T/R) switches 18a–18d, each having a common port 20a–20d, a pair of branch ports 19a–19d and 21a–21d, and a control input 22a–22d. Each one of the control inputs 22a–22d is fed by a pair of control lines $29i_1$, $\overline{29i_1}$ of buses 29i, $\overline{29i}$. The T/R switches 18a–18d are here of a type to be further explained in conjunction with FIGS. 18–19. Suffice it to say here, however, that complementary, binary or logical signals are fed to the control lines $29i_1$, $\overline{29i_1}$, respectively, and such logical signals are used to control the electrical coupling between the common port and the branch ports. Thus, for example, using an exemplary one of the T/R switches 18a–18d, here T/R switch 18a, such switch 18a has common port 20a coupled to branch port 19a in response to a first pair of logical states of control signals fed to lines $29i_1$, $\overline{29i_1}$ i.e. a logigal 1 on line $29i_1$ and a logical 0 on line $\overline{29i_1}$ and such common port 20a is coupled to branch port 21a in response to the complementary pair of logical states of the control signals fed to line $29i_1$, $\overline{29i_1}$, i.e. a logical 0 on line $29i_1$ and a logical 1 on line $\overline{29i_1}$. The common port 20a of T/R switch 18a is coupled to the feed network 14, via the transmission line 33i, as shown. Branch ports 19a and 21a of T/R switch 18a are coupled to branch ports 19d and 21b, via transmission lines 32a and 32h, respectively. Branch port 19b of T/R switch 18b is coupled to an input of a transmitter amplifier 24, via the transmission line 32d. The transmitter amplifier 24 is here formed on a semi-insulating substrate, here a gallium arsenside (GaAs) substrate. The output of transmitter amplifier 24 is coupled to the branch port 19c of T/R switch 18c, via transmission line 32e. The common port 20c of T/R switch 18c is coupled to the antenna element 26i, via transmission line 35i. The branch port 21c of T/R switch 18c is coupled to an input of the receiver amplifier 28, via transmission line 32f. The receiver amplifier 28, here a low noise amplifier, is here formed on a semi-insulating substrate (here GaAs). The output of the receiver amplifier 28 is coupled to the branch port 21d of T/R switch 18d, via transmission line 32g. The common port 20d of T/R switch 18d is coupled to the input of an active phase shifter 40, here a nonreciprocal active phase shifter having a plurality of stages (not shown, to be described in detail in connection with FIGS. 5, 6 and 7), via transmission line 32b. Suffice it to say here, however, that each stage of the active phase shifter includes a field effect transistor suitably biased to provide gain to the radio frequency signal passing through it. Control signals for the active phase shifter 40 are fed thereto, via buses $29i_2$, $\overline{29i_2}$ of bus 29i. The output of the active phase shifter 40 is coupled to the common port 23b of T/R switch 18b, via transmission line 32c.

During a transmit mode, the transceiver element 12i couples a microwave frequency signal from the radar system 11 to the antenna element 26i. A transmit signal path for coupling a signal from the radar system 11, via feed network 14, to the antenna element 26i is depicted in FIG. 2 by an open arrow 13, as shown. In the transmit mode, the control signals on lines $29i_1$, $\overline{29i_1}$ are used to couple each one of the common ports 20a–20d to the corresponding branch ports 19a–19d of the respective T/R switches 18a–18d. Thus a portion of the microwave signal is coupled from the radar system 11 to the input of the active phase shifter 40. The active phase shifter 40 is here used to vary the phase shift of the applied microwave frequency signal by a predetermined amount in accordance with control signals on buses $29i_2$, $\overline{29i_2}$ which are fed to a control input 42, of the active phase shifter 40. The microwave frequency phase shifted signal is then coupled to the input of the transmitter amplifier 24. The signal at the output of the transmitter amplifier 24 is coupled to the antenna element 26i.

During a receive mode, a portion of a received echo signal is coupled from the antenna element 26i to the radar system 11. A receive signal path for coupling the received echo signal from the antenna element 26i to the radar system 11 is depicted in FIG. 2 by solid arrows 15, as shown. During the receive mode the complementary logical states of the control signals previously on lines $29i_1$, $\overline{29i_1}$ are now fed to lines $29i_1$, $\overline{29i_1}$, and such signals are used to couple each one of the common ports 20a–20d to the branch ports 21a–21d of the respective T/R switches 18a–18d. Thus the echo signal is coupled from the antenna element 26i to the receiver amplifier 28. The signal at the output of the receiver amplifier 28 is coupled to the input of the active phase shifter element 40. The signal passing through the phase shifter is again phase shifted in accordance with the control signals fed on buses $29i_2$, $29i_2$. The phase shifted signal produced at the output of the active phase shifter element 40 is then coupled to the radar system 11, via the feed network 14. Thus it is noted that the microwave frequency signal is coupled through the active phase shifter 40 in the same direction for both the transmit mode and the received mode. Thus, referring again to FIG. 1 in a similar manner, each of the plurality of transceiver elements 12*a*–12*n* are used to couple a portion of a microwave signal between the radar system 11, via the feed network 14 and the plurality of antenna elements 26*a*–26*n*, to produce in combination a collimated and directed beam (not shown) during the transmit mode and the receive mode.

Figure 3:
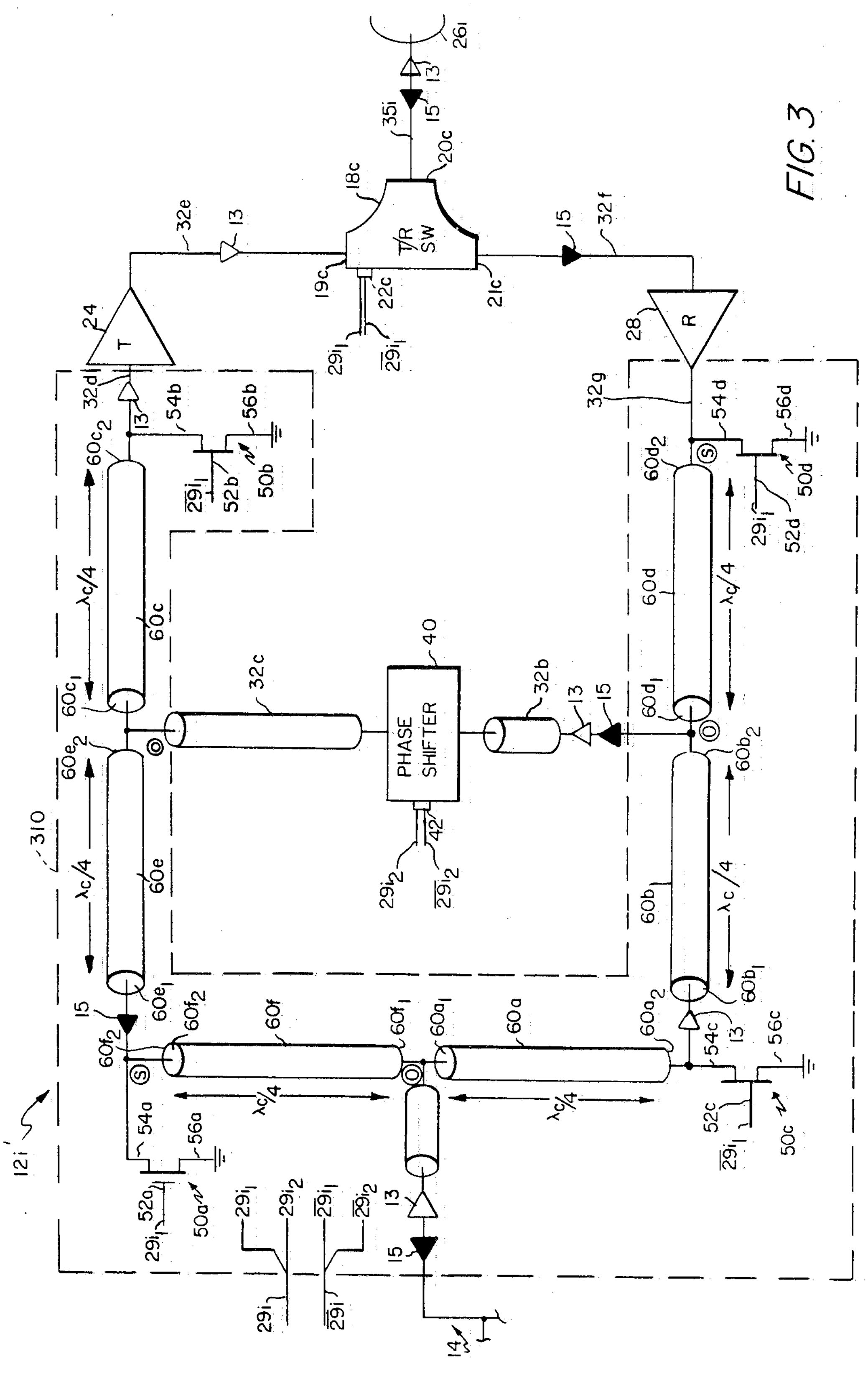
FIG. 3 is a block diagram of the transceiver element, utilizing a five port switch.

Referring now to FIG. 3 an alternate embodiment of a transceiver element 12*i'* suitable for use in the phased array antenna 10 of FIG. 1 is shown coupled to a portion of the feed network 14 and the antenna element 26*i*. Transceiver element 12*i'* here includes a five port switch 310, the active phase shifter 40, the transmitter amplifier 24, the receiver amplifier 28, and the three port T/R switch 18*c*, as shown. The five port switch 310 is formed on a substrate, (not shown) here semi-insulating gallium arsenide (GaAs) having a ground plane (not shown) here plated gold formed on the bottom surface of the substrate. Formed in active regions on portions of the top surface of the semi-insulating substrate are FET's 50*a*–50*d* here GaAs FETs, each having gate electrodes 52*a*–52*d* (FIG. 3), a drain electrode 54*a*–54*d* and a source electrode 56*a*–56*d*. The gate electrodes 52*a*, 52*d* of FET's 50*a*, 50*d*, are connected to control line $29i_1$, and the gate electrodes 52*b*, 52*c* of FET's 50*b*, 50*c* are connected to control line $\overline{29i}_1$, as shown. The FET's are here connected in a common (grounded) source configuration. The T/R switch 310 further includes transmission lines 60*a*–60*f*. Each transmission line 60*a*–60*f* has an electrical length, corresponding to one quarter wavelength ($\lambda_c/4$), where $\lambda_c$ is the wavelength of the corresponding nominal or operating centerband frequency ($f_c$) of the circuit. The feed network 14 is electrically connected to a first end $60a_1$ of $\lambda_c/4$ transmission line 60*a* and a first end $60f_1$ of $\lambda_c/4$ transmission line 60*f*, via transmission line 33*i*. The drain electrode 54*c* of FET 50*c* is electrically connected to a second end $60a_2$ of $\lambda_c/4$ transmission line 60*a*. A first end $60b_1$ of $\lambda_c/4$ transmission line 60*b* is electrically connected to the second end $60a_2$ of transmission line 60*a* and drain electrode 54*c*. A second end $60b_2$ of $\lambda_c/4$ transmission line 60*b* is electrically connected to the input port of the active phase shifter 40, via transmission line 32*b* and to a first end $60d_1$ of $\lambda_c/4$ transmission line 60*d*. The second end $60d_2$ of transmission line 60*d* is electrically connected to the output of the receiver amplifier 28 and to the drain electrode 54*d* of FET 50*d*. A second end $60f_2$ of $\lambda_c/4$ transmission line 60*f* is electrically connected to a first end $60e_1$ of $\lambda_c/4$ transmission line 60*e*, and drain electrode 54*a* of FET 50*a*. A second end $60e_2$ of $\lambda_c/4$ transmission line 60*e* is coupled to the output of the active phase shifter 40, via transmission line 32*d* and to a first end $60c_1$ of $\lambda_c/4$ transmission line 60*c*. A second end $60c_2$ of $\lambda_c/4$ transmission line 60*c* is coupled to the input of the transmitter amplifier 24 and to the drain electrode 54*b* of FET 50*b*. The connections of transmitter amplifier 24 and receiver amplifier 28 to T/R switch 18*d* are the same, as explained above in conjunction with FIG. 2.

During the transmit mode, as shown by the open arrows 13 a logical control signal on line $29i_1$ of bus 29*i* is fed to the gate electrodes 52*a*, 52*d* of FETs 50*a*, 50*b* and the complement of such logical control signal is fed (via line $\overline{29i}_1$ of bus $\overline{29i}$) to gates 52*b*, 52*c* of FETs 50*b*, 50*c*. In response to such signals FET's 50*a*, 50*d* are placed in a conducting state and FET's 50*b*, 50*c* are placed in a nonconducting state. The $\lambda_c/4$ transmission lines 60*d*, 60*e* and 60*f* have ends $60d_2$, $60e_1$ and $60f_2$ electrically connected to FET's 50*a* and 50*b*, as previously described. When FET's 50*a*, 50*d* are placed in a conducting state, a short circuit (low impedance path to ground designated by Ⓢ) is produced at the ends $60d_2$, $60e_1$ and $60f_2$ of transmission lines 60*d*–60*f* coupled to the FET's 50*a*, 50*d*. One quarter wavelength therefrom (at the second end $60d_1$, $60e_2$, and $60f_1$ of each transmission line 60*d*–60*f*) the short circuits at ends $60d_2$, $60e_1$, $60f_2$ appear as open circuits (high impedance paths to ground designated by Ⓞ) at ends $60d_1$, $60e_2$, $60f_1$, to a microwave frequency signal having a wavelength substantially equal to the wavelength of the corresponding nominal or centerband frequency of operation, for the transceiver. Thus, no signal path is provided during the transmit mode through line 60*f* and the transmitted energy passes through lines 60*a* and 60*b*. Further because end $60d_1$ appears as an open circuit Ⓞ, the transmitted energy passes from line 60*b* through line 32*b*, through the phase shifter 40 and through line 32*c*. Since end $60e_2$ appears as an open circuit Ⓞ the transmitted, and now phase shifted energy passes through line 60*c*, transmitter amplifier 22, T/R switch 18*d* and to the antenna 26*i*, as previously described in conjunction with FIG. 2.

During the receive mode as shown by the closed arrows 15, the control signals on lines $29i_1$, $\overline{29i}_1$ are switched (or complemented) in logic state placing FET's 50*a* and 50*d* in a nonconducting state, and placing FET's 50*b* and 50*c* in a conducting state. The ends $60a_2$, $60b_1$, and $60c_2$ of the $\lambda_c/4$ transmission lines 60*a*, 60*b* and 60*c* which are coupled to the drain electrodes 54*b* and 54*c* of FET's 50*b* and 50*d* are thus coupled to ground and the other ends $60a_1$, $60b_2$, and $60c_1$ of the transmission lines 60*a*, 60*b*, and 60*c* present impedances corresponding to open circuits. Thus, a received microwave signal from antenna element 26*i* is coupled to the output of the receiver amplifier 24 as explained in conjunction with FIG. 2. The received signal is then coupled through transmission line 60*d* to the active phase shifter element 40. The signal on the output of the active phase shifter 40 is thus coupled to the radar system 10 through transmission lines 60*e* and 60*f*.

Figure 4:
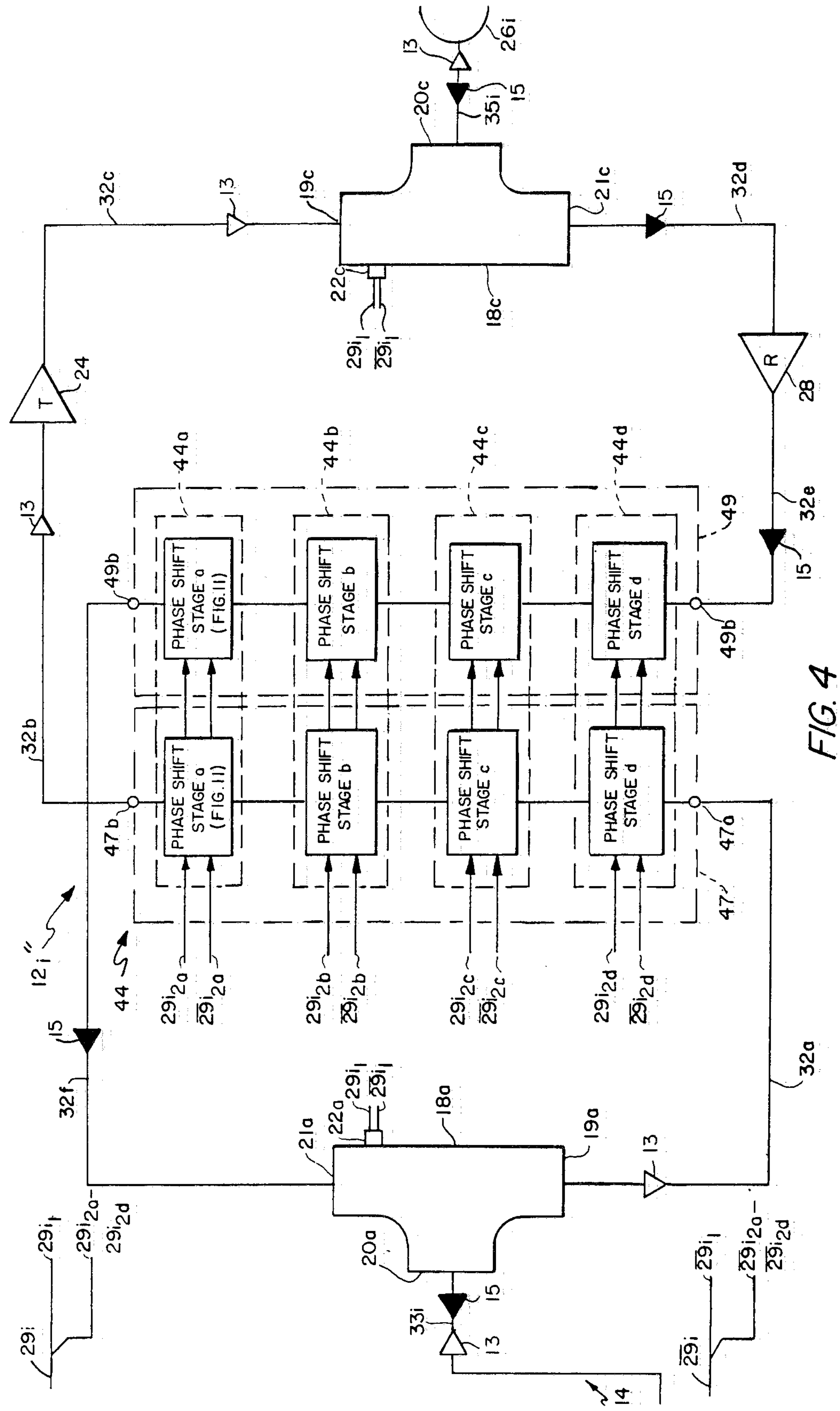
FIG. 4 is a block diagram of a transceiver using a dual channel phase shifter.

Referring now to FIG. 4, an alternate embodiment of a transceiver, here transceiver 12*i''* suitable for use in the phased array antenna 10 of FIG. 1 is shown coupled to a portion of the feed network 14, via transmission line 33*i* and to the antenna element 26*i*, via transmission line 35*i*, as shown. Transceiver element 12*i''* includes T/R switches 18*a* and 18*c*, transmitter amplifier 24, receiver amplifier 28. Here, however, a dual channel active phase shifter 44 is provided. Dual channel active phase shifter 44 has a plurality of cascade interconnected phase shift stages here 44*a*–44*d* of a type to be further described in detail in conjunction with FIGS. 10–12. The T/R switch 18*a* has common port 20*a* coupled to the feed network 14 via transmission line 33*i*. Branch ports 19*a* and 21*a* of T/R switch 18*a* are coupled to the input 47*a* of a first channel 47 and the output 49*b* of a second channel 49 of dual channel phase shifter 44, respectively, as indicated. The output 47*b* of the first channel 47 is coupled to the input of the transmitter amplifier 24, via transmission line 32*b*. The output of the receiver amplifier 28 is coupled to the input 49a of the second channel 49, via transmission line 32e. The connection of the transceiver 12" to antenna element 26i (FIG. 1) is as previously explained.

During the transmit mode, as shown by the open arrows 13, in response to complementary control signals on lines $29i_1$, $\overline{29i_1}$ a microwave signal fed to common port 20a from the radar system 11 is coupled to branch port 19a. Such signal from branch port 19a is coupled to the input 47a of the dual channel phase shifter 44. The signal is shifted in phase and coupled to the transmitter amplifier 24 and to the antenna 26, as previously described. During a receive mode, as shown by the closed arrows 15, in response to the complements of the previous control signals on lines $29i_1$, $\overline{29i}$ the microwave signal fed to the common port 20c from antenna 26i is coupled to the branch port 21c and thus to the receiver amplifier 28. The signal at the output of the receiver amplifier 28 is fed to the input 49a of the phase shifter 44. The signal shifted in phase is then fed to the T/R switch 18a to the radar system 11, as previously described.

Figure 5:
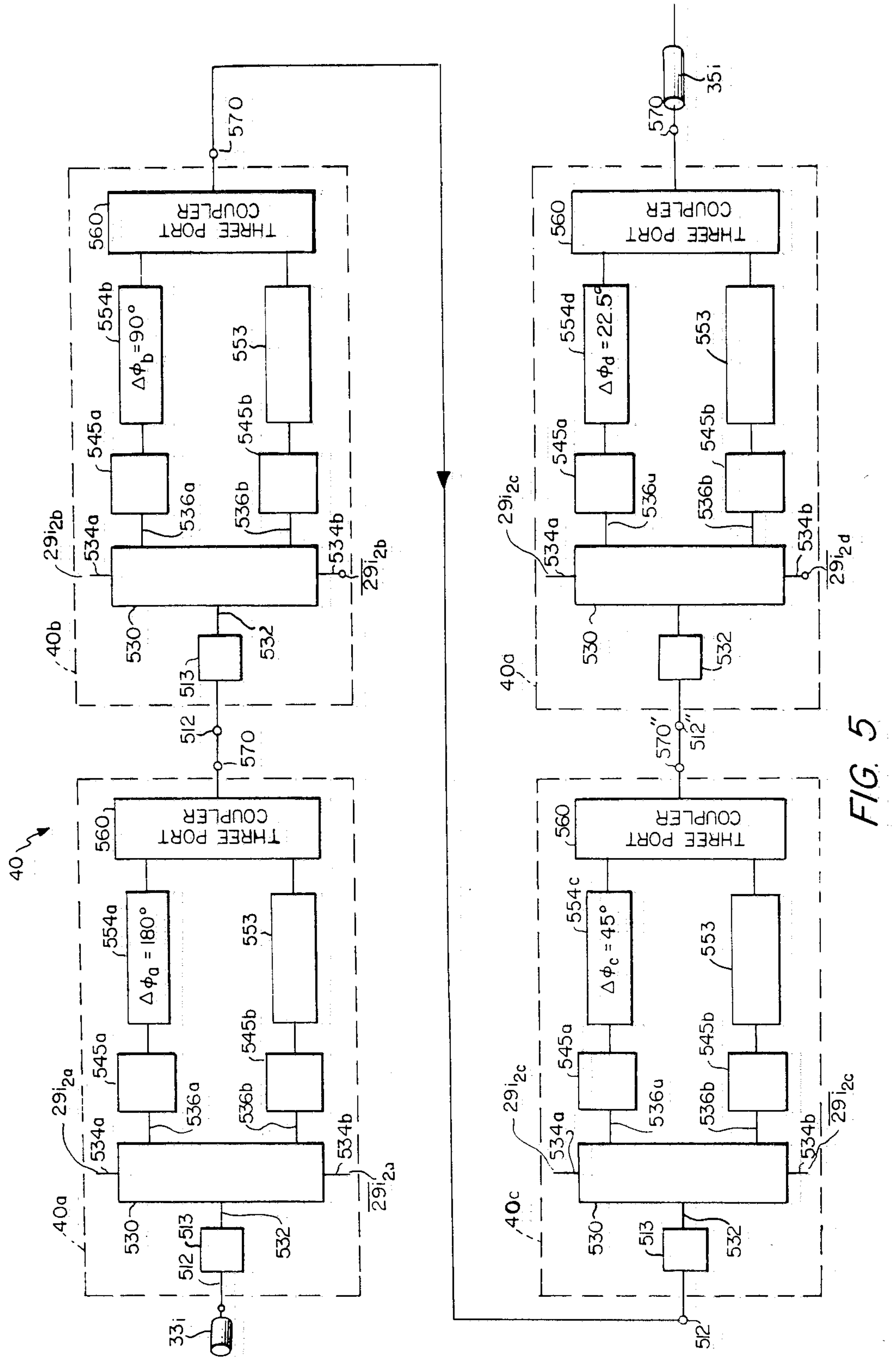
FIG. 5 is a block diagram of a 4-bit nonreciprocal phase shifter.
Figure 6:
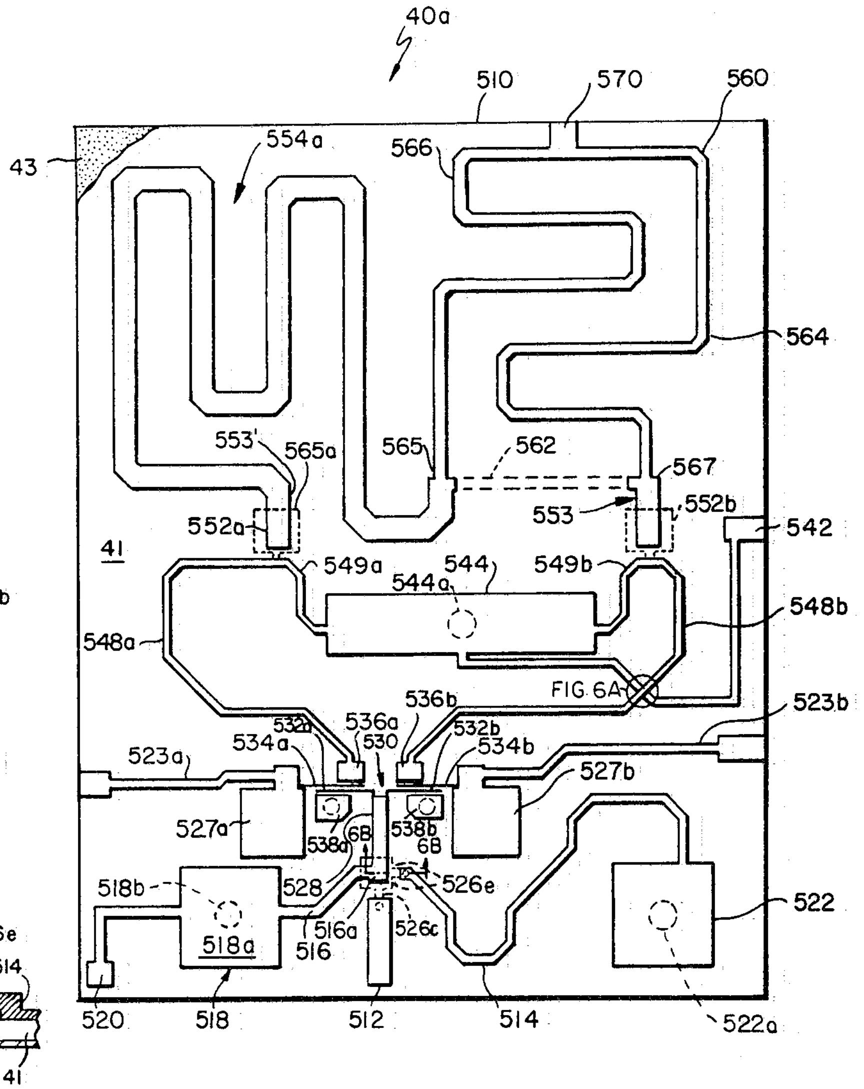
FIG. 6 is a diagrammatical view of a 180° phase shift increment stage of a 4-bit nonreciprocal phase shifter used in the one of the transceiver elements.
Figure 6A:
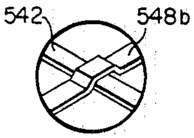
FIG. 6A is an isometric view of a bias line and output line insulated from each other with an air gap plated overlay.
Figure 6B:
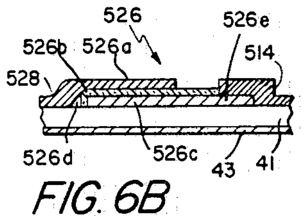
FIG. 6B is a cross sectional view of a parallel plate capacitor formed on the substrate.
Figure 7:
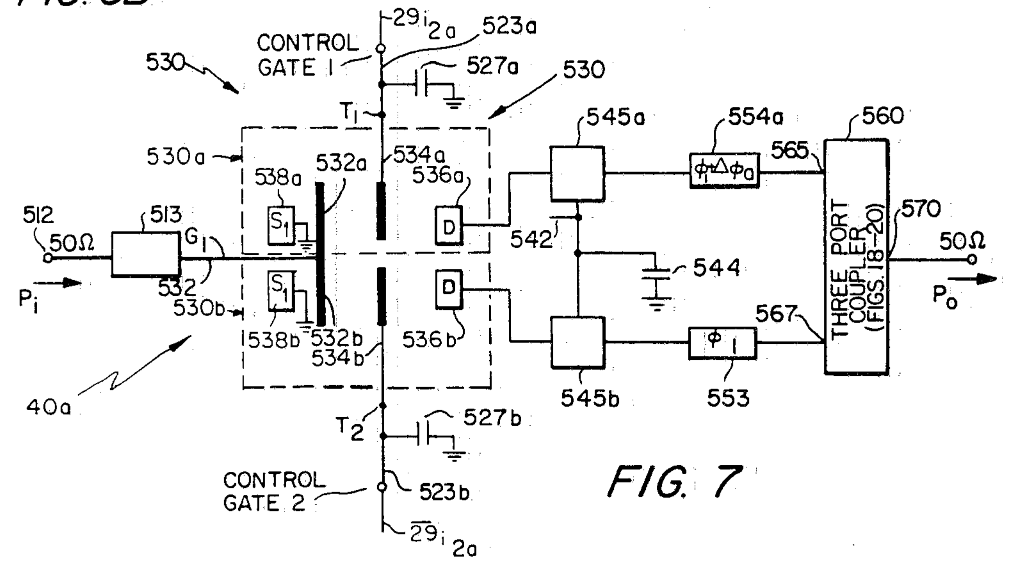
FIG. 7 is a block diagram of the phase shifter stage depicted in FIG. 5.
Figure 8:
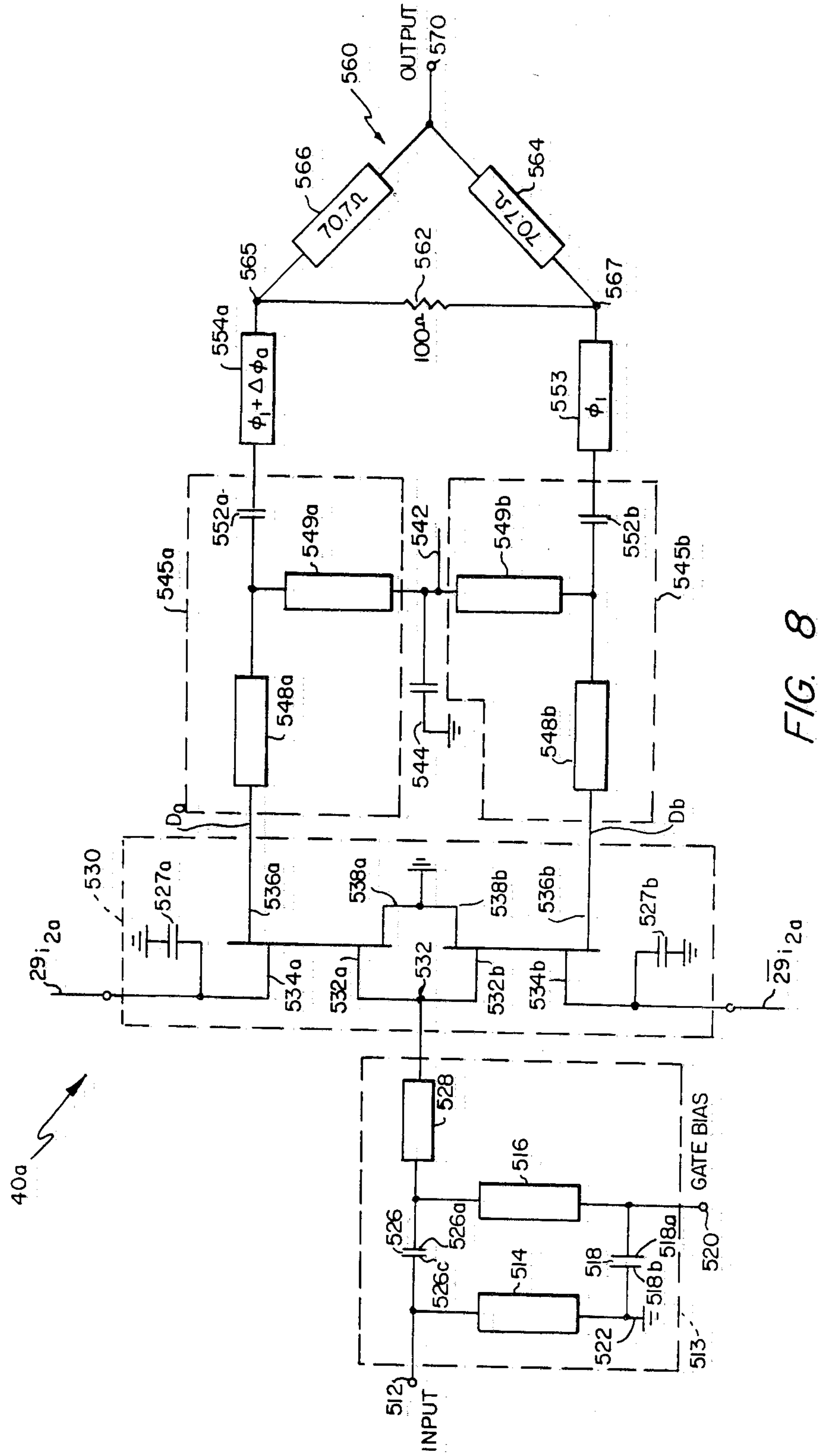
FIG. 8 is a detailed schematic diagram of the phase shifter stage depicted in FIG. 5.
Figure 9A:
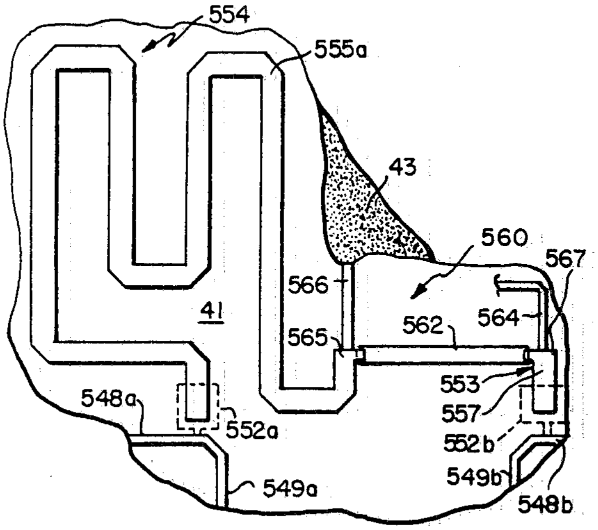
FIGS. 9A–9D are plan views of pairs of transmission lines providing electrical pathlength differences used to realize a 4-bit phase shifter.
Figure 9B:
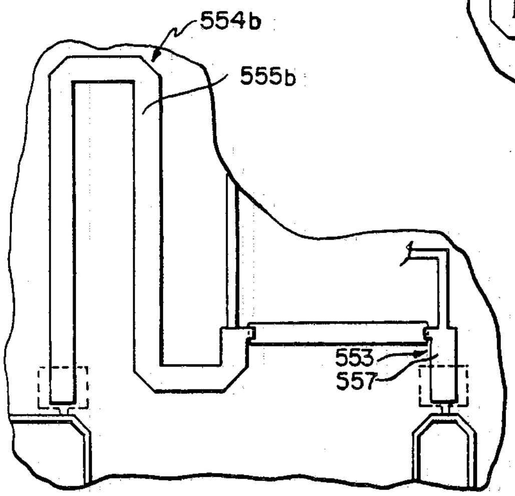
Figure 9C:
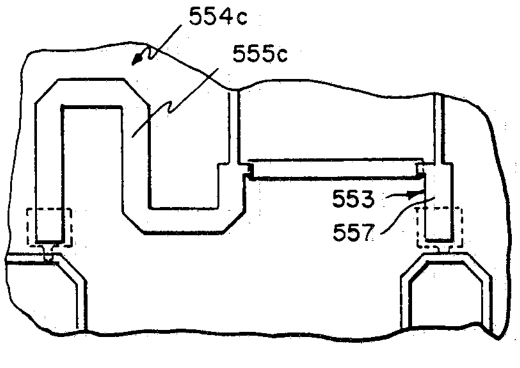
Figure 9D:
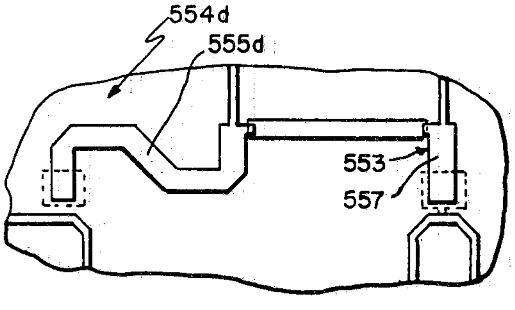

Referring now to FIG. 5, a single channel digitally controlled phase shifter 40 suitable for use in transceiver element 12i (FIG. 2) and transceiver element 12i' (FIG. 3) is shown to include a plurality of cascade interconnected stages 40a–40d with like parts of each stage being designated by the same numeral. An exemplary one of such stages 40a–40d, here stage 40a, is discussed in detail in conjunction with FIGS. 6–8. Referring now to FIG. 6, the phase shifter stage 40a is formed on a substrate 41 here of GaAs having a ground plane 43, as shown. Referring also to FIGS. 7, 8 the phase shifter stage 40a includes a microwave transmission line 512, here having an impedance of 50 ohms, coupled to an input impedance matching circuit 513. Transmission line 512 is here fed by a microwave frequency signal from transmission line 32b (FIG. 2). Input impedance matching circuit 513 is here used to match the input impedance of the phase shifter stage 40a to the charactertic impedance of the transmission line 512. The input matching circuit 513, here includes a first transmission line section 514, having a reactance which is primarily inductive, coupled in shunt to the input transmission line section 512, via a bottom plate 526c of a capacitor 526. Bottom plate 526c of capacitor 526 is coupled to one end of the shunt mounted transmission line section 514. The upper plate 518a of a second series connected capacitor 518 is coupled to line 516 and the bottom plate of 518 is coupled to ground by a via hole 518b, as shown. Ground pad 522 is coupled to ground by a via hole connection 522a. As shown in FIG. 6B, capacitor 526 is formed on the top surface of the substrate 41 here includes a top plate 526a which is coupled via an air bridge 526d to the strip conductor portion of a transmission line 528. Aligned under this top plate is a bottom plate 526c of evaporated gold formed on the substrate 41. The top plate 526a and bottom plated 526c are separated by a 5000 Angstrom (A) layer 526b of silicon nitride ($Si_3N_4$). The bottom plate 526c has a finger 526e (FIG. 6) which is used to connect the second circuit element, here transmission line section 514, to the capacitor 526. The connection is provided by a metal to metal contact which couples to the bottom plate 526c. A second transmission line section 516, here having a reactance which is primarily inductive is coupled in shunt between capacitors 518 and 526. The connection of capacitor 518 to inductor section 516 provides the bias feed 520 for the gate electrode. The input matching circuit 513 further includes the third transmission line section 528 here also having a reactance which is primarily inductive, connected between the junction of capacitor 526 with shunt mounted transmission line section 516 and a common input junction 532. The phase shifter stage 40a further includes a FET switch 530 having a dual gate FET, 530a–530b, as shown. FET's 530a and 530b include first gate electrodes 532a–532b coupled to the common junction 532, second gate electrodes 534a, 534b, separate drain electrodes 536a, 536b and separate source electrodes 538a, 538b. FETs 530a, 530b are here connected in a common (grounded) source configuration. FET 530a, 530b are fabricated such that the gains and phases provided by each FET to signals fed to the gate electrode and coupled to the drain electrode are substantially equal. In other words, $|S_{21}|_a$, the fraction of power coupled to the drain electrode 536a of 530a from a signal on gate electrode 532a substantially equals, $|S_{21}|_b$, the fraction of power available at the drain electrode 536b of FET 530b from an incident input signal provided signal gate electrode 532b of FET 530b. Similarly, $\psi S_{21}|_a = \psi S_{21}|_b$ that is, the phases of the instantaneous power delivered to each drain electrode of FET 530a, 530b are substantially equal. Control gate electrodes 534a, 534b are fed control signals on lines $29i_{2a}$, $\overline{29i_{2a}}$ (FIG. 2). These control signals are used to control the coupling of an input signal fed to the gate electrode 532a, 532b to the corresponding drains 536a, 536b of FET's 530a, 530b. High frequency components in the signals on control lines $29i_{2a}$, $\overline{29i_{2a}}$ are shorted to ground, via capacitors 527a, 527b. The drain electrodes 536a, 536b are electrically connected to identical impedance matching circuits 545a–545b, as shown. The matching circuit 545a (FIG. 8), here includes a first transmission line section 548a coupled in series between the drain electrode 536a and a coupling capacitor 552a. A second transmission line section 549a is coupled in shunt with the junction of the first transmission line section 548a, the bottom plate of capacitor 552a, and an upper plate of a dc blocking capacitor 544. The bottom plate of the dc blocking capacitor 544 is connected to ground by a via hole connection 544a (FIG. 6). The impedance matching circuit 545b is formed in a similar manner on the substrate 41 (FIG. 6) for the drain electrode 536b. The impedance matching circuit 545b includes a transmission line section 548b, a coupling capacitor 552b, and a second transmission line section 549b, coupled to the drain electrode 536b in a similar manner as the corresponding elements of impedance matching circuit 545a. The common connection of transmission line sections 549a–549b and the dc blocking capacitor 544 provides the bias feed 542 for drain electrodes 536a, 536b. As shown in FIG. 6A, the bias feed 542 here is insulated from the transmission line section 548b by a conventional air gap plated overlay. In general, such overlays are here used in all embodiments to insulate such crossing signal paths. The upper plates of coupling capacitors 552a–552b of the impedance matching circuits 545a, 545b respectively, are integrally formed with the strip conductor portion of transmission lines 554a and 553, respectively. Transmission line 554a has an electrical length which provides a phase shift $\phi_1 + \Delta\phi_a$ to an input signal coupled thereto and transmission line 553 has an electrical length which provides a phase shift of $\phi_1$ to an input signal coupled thereto. Such pair of transmission lines 554a, 553 as shown in FIG. 9*a* and described in more detail hereinafter provides one path having an unique phase shift increment $\Delta\phi_a$. Each second end of transmission line section 554*a*, 553 is coupled to a corresponding input port 565, 567 of a conventional three port coupler, which couples power from two input ports and provides the coupled power to an output port, via branch arms 562, 564. Such a coupler is described in an article entitled "GaAs Monolithic Lange and Wilkinson Couplers" by Raymond C. Waterman Jr. et al, IEEE Transactions on Electron Devices, Vol. ED-28, No. 2, February 1981. The output of the three port coupler is electrically connected to an output port 570. Capacitors 518, 526, 544, 552*a*, 552*b*, 527*a* and 527*b* are here formed in a similar manner, as explained for capacitor 526.

In operation, an input signal fed to transmission line 512 is coupled to each gate electrode 532*a*, 532*b*. Such signal is coupled to one of the drain electrodes 536*a*, 536*b* selectively in accordance with the control signals fed on lines 29*i*$_{2a}$, $\overline{29i_{2a}}$ to the control gate electrodes 534*a*, 534*b*. If the input signal in response to such control signals on lines 29*i*$_{2a}$, $\overline{29i_{2a}}$ is coupled to drain electrode 536*a*, the phase of such signal is shifted by an amount $\phi_1+\Delta\phi_a$ through transmission line 554*a*.

Conversely, the electrical path from drain electrode 536*b* to the coupler 560 provides a pathlength corresponding to a phase shift of $\phi_1$. Thus, if in response to the control signals on lines 29*i*$_{2a}$, $\overline{29i_{2a}}$, the input signal is coupled to drain electrode 536*b*, the phase of such signal at the output 570 is shifted by an amount of $\phi_1$ through transmission line 553. Thus, a phase shift of an input signal of $\phi_1$ or $\phi_1+\Delta\phi_a$ at the output 570 is selected in response to control signals on lines 29*i*$_{2a}$, $\overline{29i_{2a}}$. A plurality of such stages are cascade interconnected to form the phase shifter 40 (FIG. 5). Each stage has two paths which correspond to phase shifts of an input signal of $\phi_1$ through one path an amount $\phi_1+\Delta\phi_i$ through the second path where i is the number of the stage. For, four cascade interconnected stages, the phase shift $\Delta\phi_i$ for each stage is here $\Delta\phi_a=180°$, $\Delta\phi_b=90°$, $\Delta\phi_c=45°$ and $\Delta\phi_d=22.5°$.

Referring again to FIG. 5, with like parts in each stage being designated by the same numeral, the active nonreciprocal phase shifter 40 used to produce an output signal at port 570*d* having a predetermined phase shift relative to an input signal on transmission line 512 includes four cascaded interconnected phase shifter stages 40*a*–40*d*, as shown. Each phase shifter stage 40*a*–40*d* realized in accordance with FIGS. 6–8, selectively provides a unique phase shift to an input signal of $\Delta\phi_a=180°$, $\Delta\phi_b=90°$, $\Delta\phi_c=45°$ and $\Delta\phi_d=22.5°$, respectively. Each phase shift stage includes a unique length of transmission line between output matching circuit 545*a* and the three port coupler 560. Each length of transmission line, in conjunction with the length of transmission line 553, provides each stage with a unique pathlength difference corresponding to the unique phase shift. In response to control signals on lines 29*i*$_{2a}$–29*i*$_{2d}$, and $\overline{29i_{2a}}$–$\overline{29i_{2d}}$ selective combinations of phase shift increments of 0° or 180°, 0° or 90°, 0° or 45° and 0° or 22.5° are provided by phase shifter stages 40*a*–40*d*, respectively, where control signals fed by lines 29*i*$_{2a}$ to 29*i*$_{2d}$ and $\overline{29i_{2a}}$ to $\overline{29i_{2d}}$ are represented by A to D and $\overline{A}$ to $\overline{D}$, respectively. The phase shift $\phi$ of an input signal through phase shifter 40 may be represented by the following logical equation as:

$$\phi=[(A(\phi\phi_1+\Delta\phi_a)+\overline{A}(\phi_1))+(B(\phi_1+\Delta\phi_b)+\overline{B}(\phi_1)-)+(C(\phi_1+\Delta\phi_c)+\overline{C}(\phi_1))+(D(\phi_1+\Delta\phi_d)+\overline{D}(\phi_1)].$$

The phase shifter 40, thus, is used to vary the phase of a signal fed to transmission line 512 of stage 40*a* from 0° to 360° in here 22.5° phase shift increments.

Referring now to FIGS. 9A–9D transmission line sections 553 and 554*a*–554*d* used to provide unique incremental phase shifts for stages 40*c*–40*d* respectively, of the phase shifter 40*b* shown in FIG. 5, have like parts being designated by the same numeral. The transmission lines 553 and 554*a*–554*d* are coupled to the input ports 565, 567 of the three port coupler 560, having a thin film load resistor 562 and branch arms 564, 566, and to a portion of the impedance matching networks 545*a*–545*b*, as shown. The transmission lines 554*a*–554*d* are formed on the semi-insulating substrate 41 by strip conductors 555*a*–555*d* and 557, respectively, and the ground plane 43, which is separated by a dielectric, here the semi-insulating substrate 41. Strip conductors 555*a*–555*d* and 557 are designed to provide the corresponding transmission lines 554*a*–554*d* and 553 each with a 50 ohm characteristic impedance. The transmission lines 554*a*–554*d* each have an electrical length equal to a corresponding precise fractional wavelength $\lambda_c/2^n$, with respect to transmission line section 553, where $\lambda_c$ is the wavelength of the nominal or center-band operating frequency ($f_c$) for the active phase shifter n is the total number of stages. Thus, transmission line section 554*a* has a pathlength ($\Delta\phi_a$) equal to $\lambda_c/2$ with respect to transmission line section 553. In a similar manner, the pathlengths for segments 554*b*–554*d* with respect to transmission line 553 are $\lambda_c/4$, $\lambda_c/8$, and $\lambda_c/16$. Thus, the transmission lines 554*a*–554*d*, with respect to transmission line section 553, here represent pathlength differences corresponding to a phase shift of an applied signal with respect to the phase of such signal of 180°, 90°, 45° and 22.5°, respectively.

Figure 10:
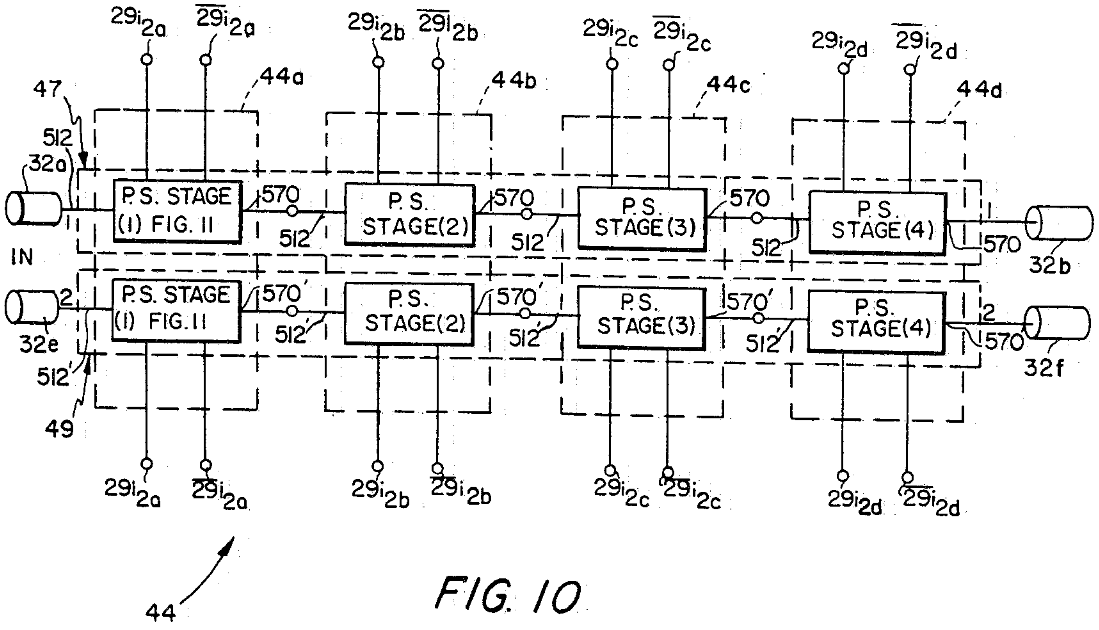
FIG. 10 is a block diagram of a 4-bit dual channel phase shifter.

Referring now to FIG. 10, a dual channel phase shifter 44 having channels 47 and 49 which is suitable for use in the transceiver 12*i*'' shown in FIG. 4 includes four one bit phase shifter stages (P.S. Stages) 44*a*–44*d* cascade interconnected together, as shown. The dual channel phase shifter stages 44*a*–44*d* are here identical except for the pathlength differences (phase shift increment) ($\Delta\phi_i$) forming the phase shift networks of each stage. Each channel of the dual channel phase shifter provides one of two signal paths, such path being selected in response to control signals fed on lines 29*i*$_{2a}$–29*i*$_{2d}$ and $\overline{29i_{2a}}$–$\overline{29i_{2d}}$. Such paths provide either a phase shift of $\phi_1$ or a phase shift of $\phi_1+\Delta\phi_i$ where i is the number of the stage. The phase shift increment ($\Delta\phi_i$) for each of the four stages 44*a*–44*d* shown in FIG. 10 are $\Delta\phi_a=180°$, $\Delta\phi_b=90°$, 90°, $\Delta\phi_c=45°$ and $\Delta\phi_d=22.5°$ for stages 44*a*–44*d*, respectively as explained in conjunction with FIGS. 9*a*–9*d*.

Figure 11:
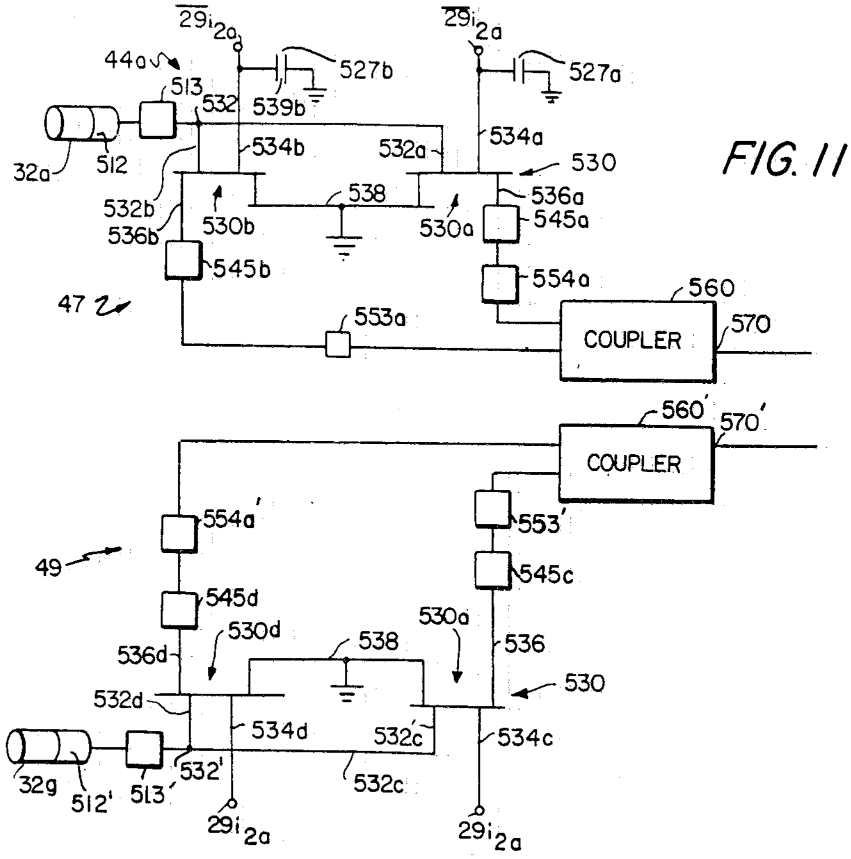
FIG. 11 is a detailed schematic of one stage of a reciprocal phase shifter.

Referring now to FIG. 11, an exemplary one of such phase shifter stages, here phase shifter stage 44*a* is shown. The phase shifter stage 44*a* includes FET's 530*a*–530*d* each having a pair of gate electrodes 532*a*–532*d*, and 534*a*–534*d*, a drain electrode 536*a*–536*d*, and a common source electrode 538. FET's 530*a*–530*d* are here realized as a double pole double throw FET switch 530 of a type disclosed in U.S. Pat. No. 4,313,126 filed May 21, 1979, and assigned to the assignee of this invention. Each of the FET's 530*a*–530*d* are here connected in a common (grounded) source configuration, as shown. Each FET 530*a*–530*d* is formed on the substrate 41 within close proximity to the other FET's 530a–530d, as shown. FETs 530a–530d are fabricated such that gains and phases provided to an input signal are substantially equal, as explained in conjunction with FIGS. 6–7.

The first phase shifter channel 47 includes a microwave transmission line 512, here coupled to the transceiver 12i'' (FIG. 4), via transmission line 32a providing a signal input for the phase shifter stage 44a. The microwave transmission line 512 is electrically connected to an impedance matching circuit 513a previously described in conjunction with FIGS. 6–8. Matching circuit 513 is electrically connected to the common input junction 532. Input junction 532 is coupled to input gate electrodes 532a, 532b of FET's 530a, 530b, respectively. Signals fed on lines $29i_{2a}$, $\overline{29i_{2a}}$ from the radar system 11 (FIG. 1) are fed to the second gate electrodes 534a, 534b for controlling the conduction of an input signal on input gate electrodes 532a, 532b to the corresponding drain electrodes 536a, 536b of FET 530a, 530b, respectively. High frequency signal components on control signals fed on lines $29i_{2a}$, $\overline{29i_{2a}}$ are shorted to ground by capacitors 527a, 527b. An input signal fed equally to input gate electrodes 532a, 532b is selectively coupled, to the corresponding drain electrode 536a, 536b, in accordance with the control signals on lines $29i_{2a}$, $\overline{29i_{2a}}$ fed to the control gate electrodes 534a, 534b. The drain electrode 536c is electrically connected to an impedance matching network 545a as described in conjunction with FIGS. 5–7. The drain electrode 536b is similarly, electrically connected to the impedance matching network 545b, as shown. The impedance matching network 545a is coupled to here, the microwave transmission line 554a. In a similar manner, the impedance matching network 545b is coupled to the microwave transmission line 553. Each second end of transmission lines 553 and 554a is coupled to the pair of input ports 565, 567 of the conventional three port coupler 560.

The second channel 49 of digital phase shifter stage 44a includes microwave transmission line 512' coupled to transceiver 12i'' (FIG. 4) via transmission line 32g (FIG. 2) for providing the signal input for channel 49. The microwave transmission line 512' is electrically connected to an impedance matching circuit 513' as previously disclosed in conjunction with FIGS. 5–7. A second matching circuit 513' is electrically connected to a common junction 532'. Common junction 532' is electrically connected to input gate electrodes 532c, 532d of FET's 530c, 530d. Control gates 534c, 534d of FET 530c, 530d are electrically connected to gate electrode pads 524 and 527, respectively. The control gates 534c, 534d are fed signals on lines $29i_{2a}$, $\overline{29i_{2a}}$ from the radar system 11 (FIG. 1) for controlling conduction of an input signal on input gate electrodes 532c, 532d to the drain electrodes 536c, 536d of FET's 530a, 530b, respectively. Drain electrodes 536c–536d are electrically connected to impedance matching networks 545c–545d as disclosed in conjunction with FIGS. 6–8. Transmission lines 553' and 554a', are coupled between the impedance matching networks 545c–545d and the three port coupler 560'. The three port coupler 560' is electrically connected to output port 570'.

The total pathlength difference of the connection of drain electrode 536a to the three port coupler 560, for channel 47 is then selected to provide a corresponding phase shift equal to $\phi_1+\Delta\phi_a$, as explained in conjunction with FIGS. 9a–9d. The total pathlength difference of the connection of drain electrode 536b to the three port coupler for channel 47 is selected to provide a corresponding phase shift equal to $\phi_1$. Thus, the phase of a signal applied to the gate electrodes 532a, 532b is shifted by an amount $\phi_1+\Delta\phi_a$ or $\phi_1$ selectively in accordance with control signals fed to control gate electrodes 534a, 534b. In the same manner, transmission lines 553', 554a' provide pathlengths to channel 49 between drains 536c, 536d of $\phi_1+\Delta\phi_a$ or $\phi_1$.

Referring again to FIG. 10, the dual channel phase shifter 44 having channels 47 and 49 has stages 44a–44d, each stage providing a unique phase shift to an applied signal. Each channel provides selective combinations of phase shift increments $\Delta\phi_a=180°$, $\Delta\phi_b=90°$ $\Delta\phi_c=45°$, and $\Delta\phi_d=22.5°$ in response to control signals on lines $29i_{2a}$–$29i_{2d}$, $\overline{29i_{2a}}$–$\overline{29i_{2d}}$.

Figure 12:
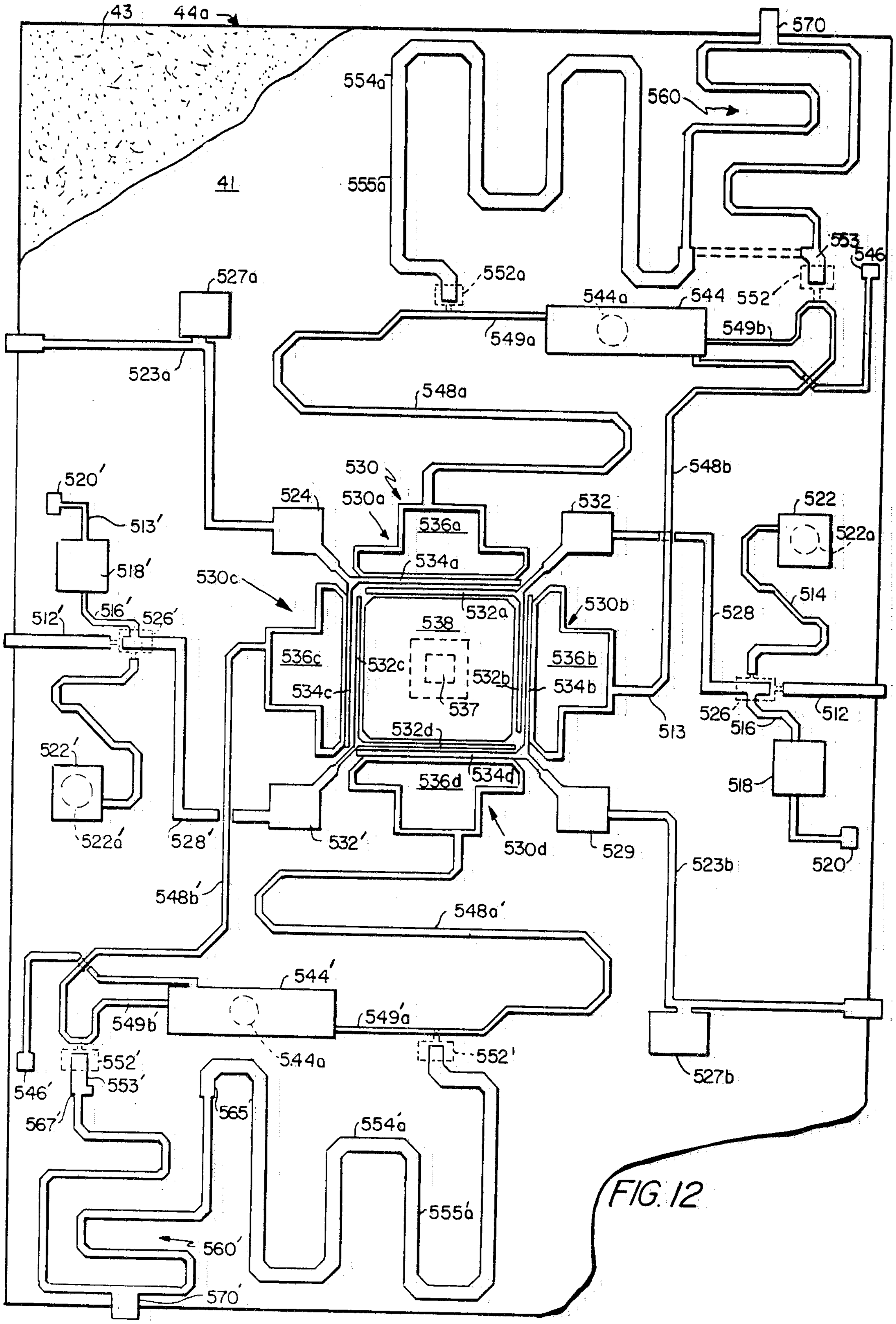
FIG. 12 is a diagrammatical view of the stage of a dual channel phase shifter depicted in FIG. 11.

Referring now to FIG. 12, the phase shifter stage 44a is shown, formed on a semi-insulating substrate 41 having a ground plane 43 on one side thereof, as shown. A low inductance ground connection 537 is here made through the source electrode region 538. Parallel plate capacitors such as 526 are formed on the substrate 41, as previously described in conjunction with FIG. 6B. Crossing signal paths are insulated one from another by conventional air gap plated overlays as described in conjunction with FIG. 6A.

Referring also to FIG. 5, the net overall gain for each four bit phase shifter 40 and 44 is approximately 8 decibels (db) or approximately 2 db per stage. Each stage contributes 3 db of loss from splitting of the input signal and another 3 db of loss due to power recombining at the three port coupler 560. The total losses due to parasitic losses and the matching networks are less than 1 db. Allowing for substantial mismatch, a gain of approximately 8 db generally is realizable from a dual gate FET, operating at X-band, for example. Thus, a net gain of approximately 2 db per stage or approximately 8 db for the phase shifters of FIG. 9 and FIG. 12 is realized. Since only four FETs, one per stage, at any given time are operating for each phase shifter, 40, 44 the d.c. power consumption will be four times that for one FET.

Figure 13:
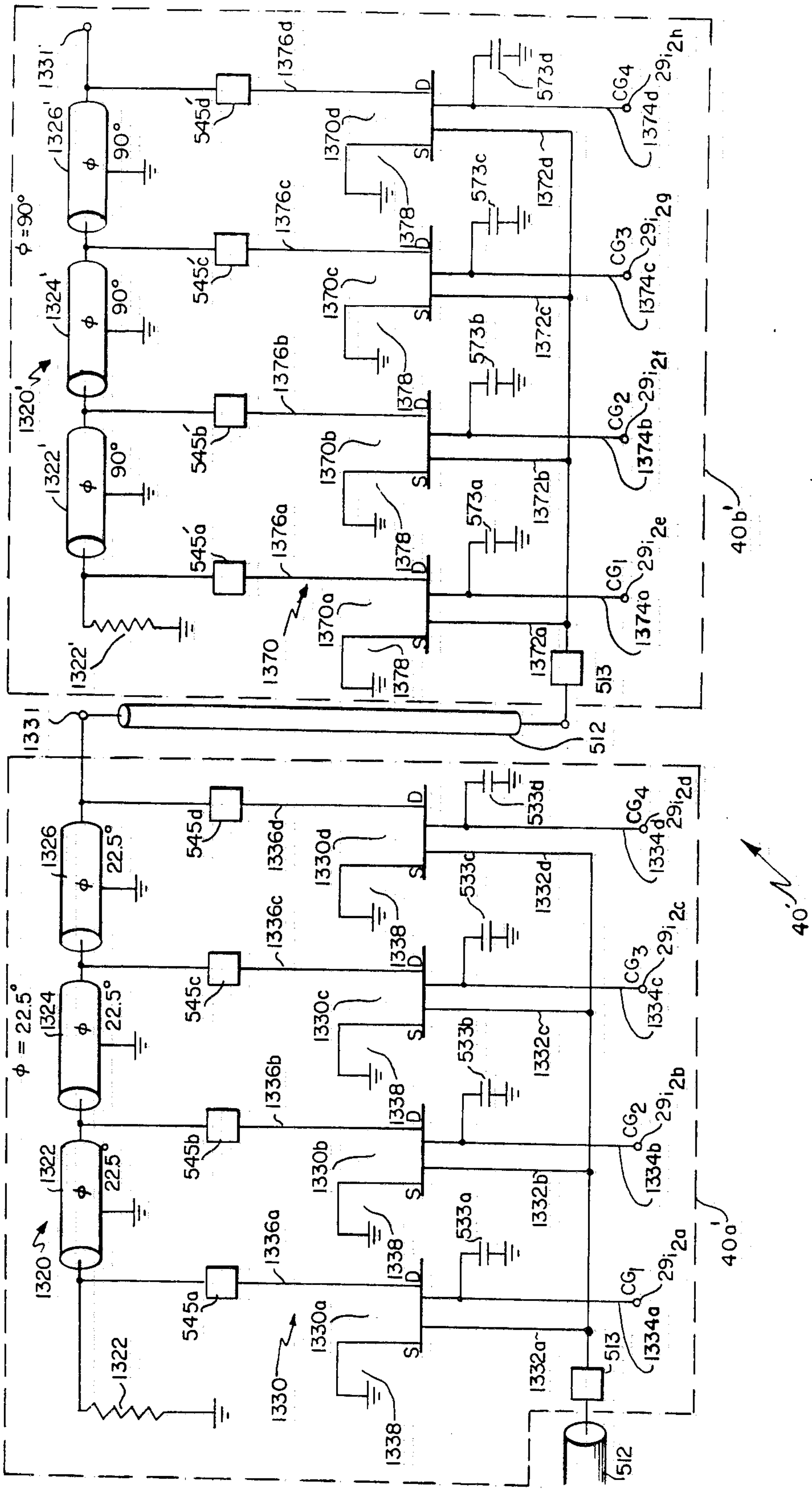
FIG. 13 is a detailed schematic of an alternate embodiment of a four bit nonreciprocal phase shifter.

Now referring to FIG. 13, an alternate embodiment for a four bit digitally controlled phase shifter 40' suitable for use in transceivers 12i and 12i' (FIG. 2 and FIG. 3) includes a first stage 40a' having a single pole four throw (SP4T) FET switch 1330 and a second stage 40b' having an SP4T FET switch 1370, as shown. The SP4T FET switches 1330 and 1370 are here of a type disclosed in the above mentioned U.S. Pat. No. 4,313,126. Each stage 40a', 40b' is formed on a substrate (not shown), having a ground plane (not shown).

The first stage 40a' of the four bit digital phase shifter 40' further includes FET's 1330a–1330d, as shown. FET's 1330a–1330d are fabricated such that gains and phases provided to an input signal are substantially equal, as explained in conjunction with FIG. 5–7. Each FET 1330a–1330d, includes a input gate 1332a–1332d, a control gate 1334a–1334d, drain electrodes 1336a–1336d and a source region 1338. FET's 1330a–1330d are here connected in a common (grounded) source configuration. A low inductance ground connection is here made from the source electrode 1338 to the ground plane 43 (not shown) by a conventional via hole connection.

A microwave transmission line 512, here having an impedance of 50 ohms is coupled to an impedance matching circuit 513, as previously explained in conjunction with FIGS. 4–6. The impedance matching circuit is coupled to input gate electrodes 1332*a*–1332*d*. The drains 1336*a*–1336*d* are electrically connected to identical impedance matching networks 545*a*–545*d* of a type previously described in conjunction with FIG. 8. Impedance matching networks 545*a*–545*d* are each coupled to a transmission line 1320 having a characteristic impedance $Z_o$, here 50 ohms. Transmission line 1320 is terminated at one end in a resistor 1322, here having a value equal to 50 ohms, the characteristic impedance of the transmission line 1320. The resistor 1322 is coupled in shunt between the transmission line 1320 and ground. Drain electrode 1336*d* is electrically connected to the end of transmission line 1320 through the impedance matching network 545*d*. Drain 1336*c* of FET 1330*c* is electrically connected to transmission line 1320, through the matching network 545*c* defining a section of transmission line 1326, drain electrode 1336*b* of FET 1330*b* is electrically connected to transmission line 1320 through the matching network 545*b* defining a section of transmission line 1324, and drain electrode 1336*a* of FET 1330*a* is electrically connected to transmission line 1320, through the matching network 545*a*, defining a section of transmission line 1322. Here, all the transmission line sections 1322–1326 have the same electrical length and thus each section shifts the phase of an applied signal by an equal amount. The total phase shift of an output signal with respect to the phase of the input signal fed through transmission line 512 is the sum of the phase shifts provided by each of the equal electrical lengths transmission line sections 1322, 1324 and 1326 of which the output signal passes through from a selected one of the drain electrode 1336*a*–1336*d* to the output port 1331.

In operation, an input signal is coupled or decoupled between the gate electrodes 1332*a*–1332*d* and the corresponding drain electrode 1336*a*–*1336d* selectively in accordance with control signals fed to control gate electrodes 1334*a*–1334*d* on lines $29i_{2a}$–$29i_{2d}$ provided by suitable modification of the radar system 11 (FIG. 1). Signals on control lines $29i_{2a}$–$29i_{2d}$ are here logical control signals. One of such signals on lines $29i_{2a}$–$29i_{2d}$ is selected to be in an "on" state, while the remaining ones of such signals on lines $29i_{2a}$–$29i_{2d}$ are placed in an "off" state, thus placing only one FET of the FETs 1330*a*–1330*d*, in a conductive state and the remaining ones of such FET's 1330*a*–1330*d*, in a non-conductive state. Similarily the output signal from the first stage is coupled or decoupled between the gate electrodes 1372*a*–1372*d* and the corresponding drain electrode 1376*a*–1376*d* selectively in response to control signals fed to control gate electrodes 1374*a*–1374*d*, via lines $29i_{2e}$–$29i_{2h}$, as shown.

In response to a control signal fed to one of the control gate electrodes 1334*a*–1334*d* the corresponding one of the FET's 1330*a*–1330*d* is placed in a conducting state, coupling the input signal on the input gate electrode of such FET, to the corresponding drain electrode of such FET. The remaining FET's of the FET's 1330*a*–1330*d* are held in a nonconducting state by control signals fed to remaining ones of the control gates 1334*a*–1334*d*. Thus, a signal coupled to the transmission line 1320 from drain electrode 1336*a* will have a net phase shift of $3\Delta\phi$ with respect to phase of an input signal on drain electrode 1336*a*, because the signal coupled from drain electrode 1336*a* will pass through the three phase shift sections 1322, 1324 and 1326 of transmission line 1320 before arriving at the output port 1330. In a like manner, a signal applied from the drain electrode 1336*b* to transmission line 1320 will have a net phase shift of $2\Delta\phi$, a signal applied from drain electrode 1331*c* to transmission line 1320 will have an incremental phase shift of $\Delta\phi$, and a signal applied from drain electrode 1336*d* to transmission line 1320 will have an incremental phase shift of 0° with respect the signal on drain electrode 1336*d*. Thus by selective application of control signals fed to control gates 1334*a*–1334*d* an incremental phase shift of $3\Delta\phi$, $2\Delta\phi$, $\Delta\phi$, or 0° may be obtained. By selecting the electrical length of each incremental phase shift ($\Delta\phi$) of the first stage equal to be 22.5°, a total phase shift of up to 67.5° is provided by the first stage. The phase shift provided by the matching network 545*a*–545*d* is the same for each drain electrode matching circuit and thus does not affect the differential phase shift produced.

The output of the first stage 40*a'* is electrically connected to the input of the second stage 40*b'*, as shown. The second stage 40*b'* of the four bit digital phase 40' is identical to the first stage 40*a'* except for the electrical length of the transmission line 1320'. In a like manner, as discussed for the first stage 40*a'*, the second stage of the four bit 7 digital phase shifter 40' has drain electrodes, here 1376*a*–1376*d* electrically connected to a portion of a transmission line 1320'. The incremental phase shift of transmission line 1320' is here set to 90°. Thus, a total phase shift of 270° at the output 1331' is obtainable in the second stage 40*b'*. This in combination with the first stage 40*a'* having a total available phase shift of 67.5° provides the four bit digital phase shifter 40', having a capability of providing a 360° phase shift, in 22.5° increments.

Figure 14:
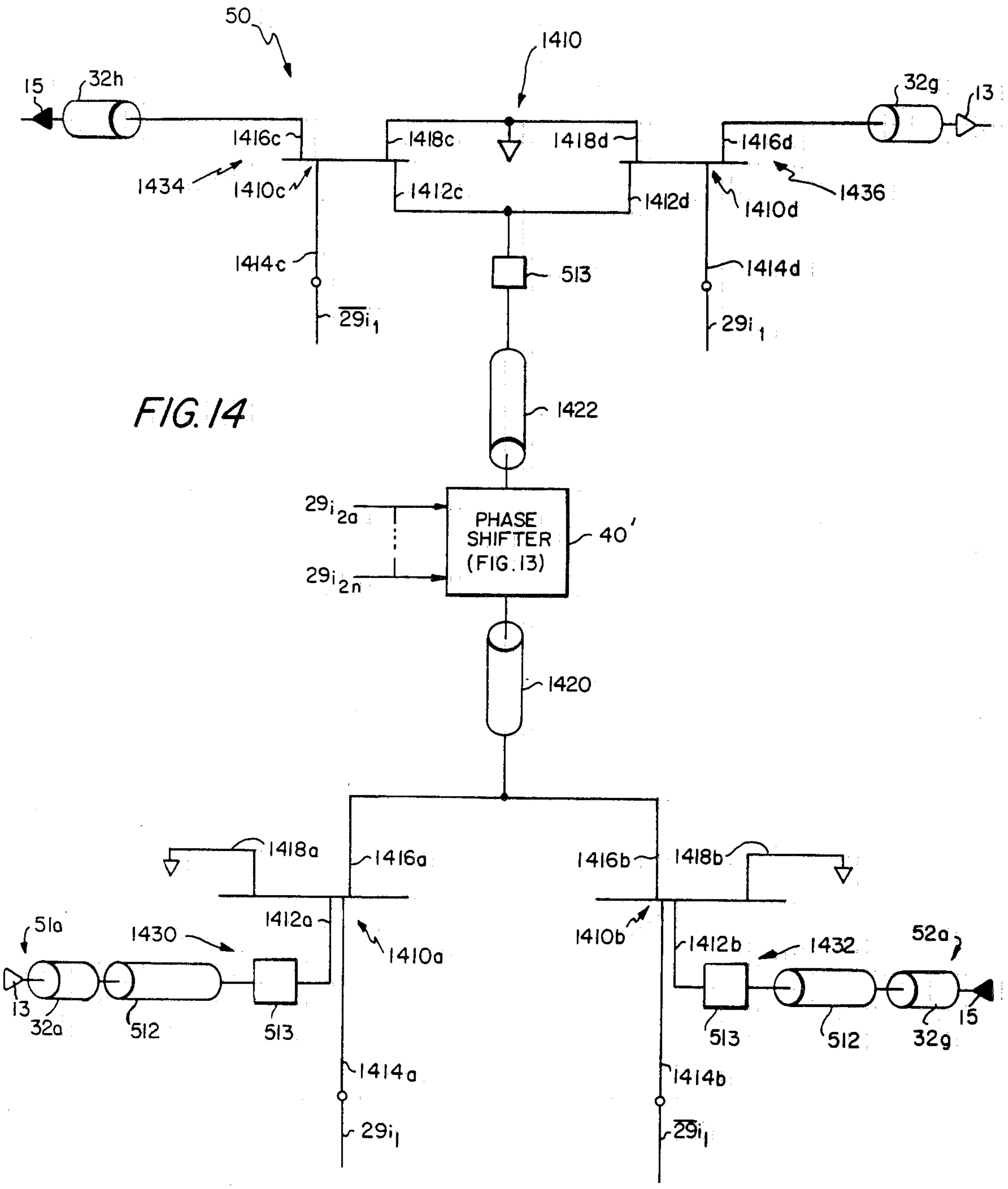
FIG. 14 is a block diagram of the nonreciprocal phase shifter of FIG. 13, including reciprocating switches.

Now referring to FIG. 14, a digitally controlled phase shifter section 50 suitable for use in the transceiver 12*i* (FIG. 2), by replacing T/R switches 18*b*, 18*d* and phase shifter 40, and for transceiver 12*i''* (FIG. 4) by replacing phase shifter 44, includes the single channel phase shifter 40' of FIG. 13, and FET's 1410*a*–1410*d*. Each FET 1410*a*–1014*d* has a signal gate electrode 1412*a*–1412*d*, a control gate electrode 1414*a*–1414*d*, drain electrodes 1416*a*–1416*d*, and source electrodes 1418*a*–1418*d*, as shown. FET's 1410*a* 1410*d* are connected in a common (grounded) source configuration. The signal gate electrodes 1412*a*, 1412*b* of FET's 1410*a*, 1410*b* are here coupled to the transmission lines 32*a* and 32*g* of the transceiver 12*i* (FIG. 2) respectively, through a pair of impedance matching circuits 513, as described in conjunction with FIG. 5. Each drain electrode 1416*a*, 1416*b* is coupled to the phase shifter 40' via transmission line 1420. The output of the phase shifter 40' is coupled to the input gate electrodes 1412*c*, 1412*d* of FET's 1410*c*, 1410*d*, respectively, via transmission line 1422 and impedance matching circuit 513. The drain electrodes 1416*c*, 1416*d* are coupled to transmission lines 32*h* and 32*g*, respectively, of the transceiver 12*i* (FIG. 2). In operation, one of a pair of input signals fed to the signal gate electrodes 1412*a*, 1412*b* of input channels 1430, 1432 is selectively coupled to the corresponding drain electrodes 1416*a*, 1416*b* in response to signals fed to control gate electrodes 1414*a*, 1414*b* on lines $29i_1$, $\overline{29i_1}$. Such selectively coupled signal is fed to the phase shifter 40' and the phase of such signal is shifted in response to control signals $29i_{2a}$–$29i_{2h}$ as previously described. One of the pair of output channels 1434, 1436 is selected, by signals on lines $29i_1$, $\overline{29i_1}$ fed to control gates 1414*c*, 1414*d*. The phase shifted signal, is coupled to the input gate electrodes 1412*c*, 1412*d* of FETs 1410*c*, 1410*d*. The phase shifted signal fed to each of the input gate electrodes 1412*c*, 1412*d* is coupled to one of the drain electrodes 1416*c*, 1416*d* selectively in response to control signals on lines $29i_1$, $\overline{29i_1}$ fed to control gates 1414*c*, 1414*d*, respectively, as previously explained. The signal on the selected one of the drain electrodes 1416*c*, 1416*d* is coupled to transmission lines 32*h* during the receive mode or 32*d* of the transceiver 12*i* (FIG. 2) during the transmit mode.

Assuming one milliwatt of power consumption per FET, the power consumption of the phase shifter 50 is four milliwatts since four FET's are conducting at the same time. Two FET's of the four reciprocating switches conduct and one FET in each of stages 40*a'* and 40*b'* (FIG. 13) conducts, during operation of the phase shifter. The net overall gain for the phase shifter section 50 is approximately 4 db. This assumes a 6 db loss due to input signal division into the four channels, FET's 1330*a*–1330*d* of phase shifter stage 40*a'* (FIG. 13) and 6 db of loss due to input signal division for stage 40*b'* (FIG. 13). In addition, there is a loss of 3 db in each stage (40*a'*, 40*b'*) attributable to the terminating resistors 1322 for transmission lines 1320 and 1320' (FIG. 13), and there is a loss of 1 db per stage due to parasitics and the matching circuits. These losses are partially compensated for by a minimum of 8 db gain for each FET resulting in a net loss of at most 2 db per stage. Moreover, the FET switches 1410*a*–1410*d* contribute 16 db of gain (8 db per switch, two switches active at one time). This gain is reduced, however, by 3 db due to signal division into the two channels of FET's 1410*a*, 1410*d* and 1 db due to parasitics and the matching circuits. Thus, the net gain for the phase shifter 50 is approximately 4 db.

Figure 15:
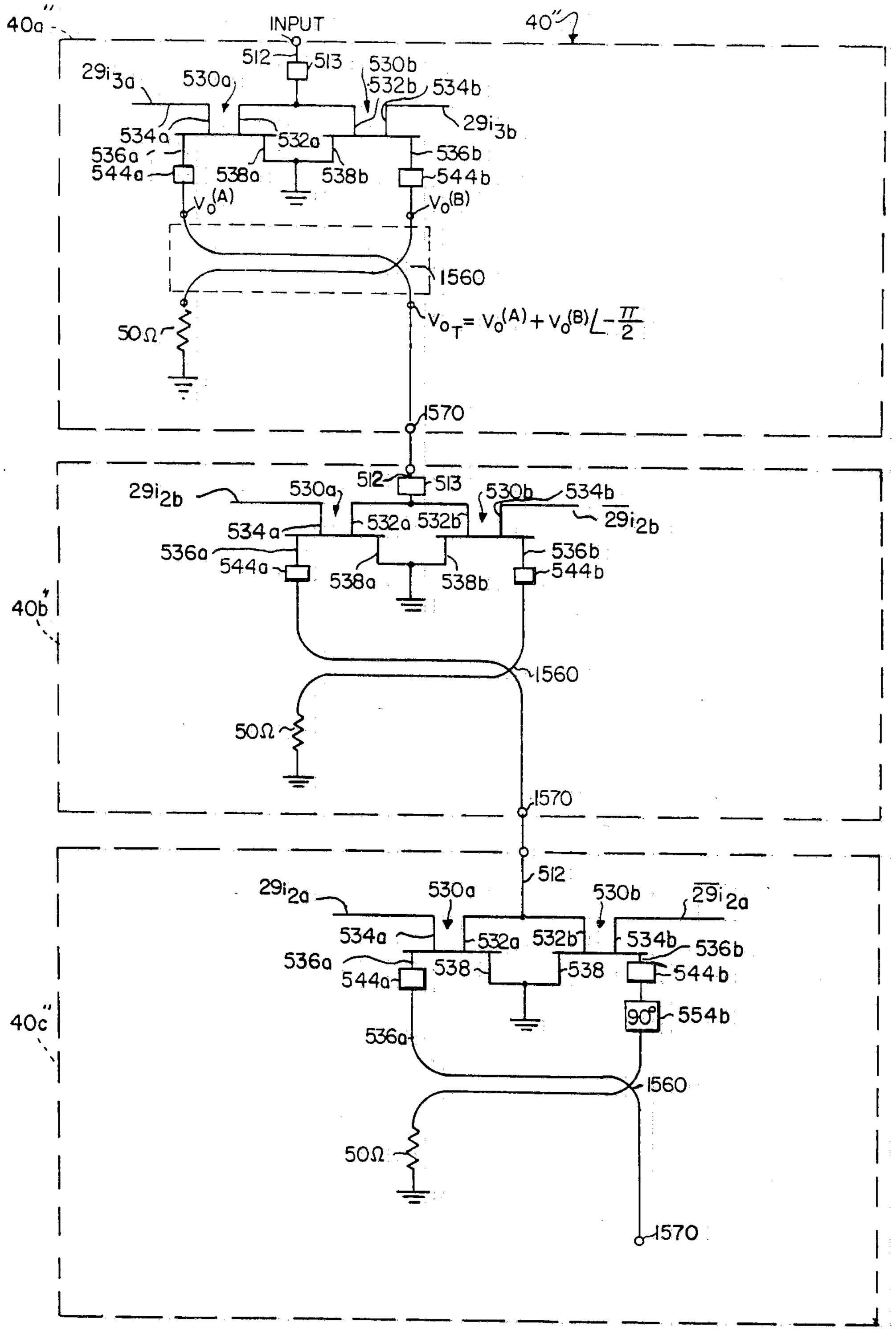
FIG. 15 is a detailed schematic diagram of a variable phase shifter utilizing a quadrature coupler.

Referring now to FIG. 15, an alternate embodiment of an phase shifter 40'' suitable for use in transceiver 12*i* (FIG. 2) and 12*i'* (FIG. 3), includes a first phase shifter stage 40*a''*, a second phase shifter stage 40*b''*, and a third phase shifter stage 40*c''* cascade interconnected, as shown. Each phase shifter stage 40*a''*, 40*b''* and 40*c''* is similar to the digitally controlled phase shifter stage 40*a* described in conjunction with FIGS. 6–8. Phase shifter stage 40*a''* is here used, however to provide a variable continuous phase shift between 0° and 90°. Phase shifting stage 40*b* is used to produce a phase shift of $\phi=0°$ or a phase shift of $\phi=90°$, and phase shifter stage 40*c''* is used to produce a phase shift of $\phi=0°$ or $\phi=180°$. The cascade interconnection of phase shifter stages 40*a''*, 40*b''* and 40*c''* provides the phase shifter 40'' which is capable of varying the phase of an input signal continuously over the range of 0° to 360°.

Referring also to FIG. 16–FIG. 17, an exemplary one of the stages 40*a''*–40*c''* here 40*a''* is formed on the substrate 41 having a ground plane 43. The phase shifter stage 40*a''* is coupled to transmission line 32*b* of the transceiver 12*i* (FIG. 2). The phase shifter stage 40*a''* includes a transmission line 512 coupled between the input matching network 513 as explained in conjunction with FIG. 5 and the transmission line 32*b* of transceiver 12*i* (FIG. 2). The matching network 513 is coupled to input gate electrodes 532*a*, 532*b* of a pair of FET's 530*a*–530*b*, as shown. FET's 530*a*–530*b* further include control gate electrodes 534*a*–534*b*, source electrodes 538*a*–538*b*, and drain electrodes 536*a*–536*b*. FET's 530*a*–530*b* are fabricated, such that gains and phases provided to an input signal fed to the input gate electrodes 532*a*, 532*b* are substantially equal at the drain electrodes 536*a*, 536*b*, as explained in conjunction with FIG. 6. FET's 530*a*–530*b* are here connected in a common (grounded) source configuration, as shown. The control gate electrodes 534*a*–534*b* are fed voltage level control signals on control lines $29i_{3a}$, $29i_{3b}$. The radar system (FIG. 2) provides the control signals on lines $29i_{3a}$, $29i_{3b}$ (not shown in FIG. 2). The levels of such signals on the control lines $29i_{3a}$, $29i_{3b}$ are used to control the operating point of each FET and hence the amplitude of signals coupled to the drain electrodes 536*a*, 536*b*. The drain electrodes 536*a*, 536*b* are electrically connected to capacitor 544 and impedance matching networks 545*a*, 545*b* as described in conjunction with FIGS. 6–8. In the preferred embodiment of the invention, the impedance matching networks 545*a*, 545*b* are electrically connected to a conventional four port or quadrature coupler 1560. Such a coupler is described in an article entitled "GaAs Monolithic Lange and Wilkinson Couplers" by Raymond C. Waterman, Jr. et al, IEEE Transactions on Electron Devices, Vol. ED-28, No. 2, February 1981. A quadrature coupler is here used to couple input signals on each input of the coupler, in quadrature, to the output. In other words, the phase of the input signal from drain electrode 536*b* as coupled to the output 1570 of the coupler will lag the phase of the input signal from drain electrode 536*a* as coupled to the output 1570 of the coupler by 90°.

Thus, unlike prior embodiments of the invention when signals fed to the control gate electrodes 534*a*–534*b* are complementary pairs of control signals, such signals provided to place an FET in an off-state or an on-state, the signals fed on lines $29i_{3a}$, $29i_{3b}$ to the control gate electrodes 534*a*, 534*b*, here are selectable voltage levels between pinchoff and zero volts "on" levels of such FET.

An output voltage signal $V_o$, when measured at the drain electrode, of an input signal $V_i$ fed to the input gate electrode is given as: $V_i=A_oe^{j\omega t}$, is $V_o=BA_oe^{j(\omega t+\psi)}$, for embodiments disclosed in conjunction with FIGS. 5–14 where B is the gain $\psi$ and is the phase provided to the input signal by the FET. However, if the control signals on lines $29i_{3a}$, $29i_{3a}$ fed to the control gates 534*a*–534*b* provide voltage level signals which change the operating point of the FET between the off state and the on state, the FET's 530*a*, 530*b* no longer function as switches, and, instead the FETs 530*a*, 530*b* function as variable gain amplifiers. When the output voltage $V_o^{(A)}$ of the FET 530*a* is a function of the control gate voltage $V_{(g)}$ fed to control gate 534*a*, the portion of the output voltage $V_{ot}$ at the output of the coupler 1560 from the voltage $V_o^{(A)}$ is given as: $V_o=B_AA_oe^{j(\omega t+\psi+\Delta\phi n)}$, where $B_A$ is the gain of FET 530*a* as a function of the control gate voltage, $\Delta\phi_n$ is the phase shift corresponding to the pathlength between the drain electrode of the $n^{th}$ FET and the output of the coupler 1560. The output voltage of FET 530*a* and FET 530*b* may be represented as:

$$V_o^{(A)};\ V_o^{(B)}$$

where $$V_o^{(A)}=B_AA_oe^{j(\omega t+\psi)};\ V_o^{(B)}=B_B\,A_oe^{j(\omega t+\psi)}$$

Since the quadrature coupler 1560 combines the two input signals $V_o^{(A)}$ and $V_o^{(B)}$ in quadrature, the output voltage at the coupler 1560 may be represented as:

$$V_{oT}=V_o^{(A)}-jV_o^{(B)}$$

or $$V_{oT}=B_A A_o e^{j(\omega t+\psi+\Delta\phi A)}+B_B A_o e^{j(\omega t+\psi+\Delta\phi B)}$$

or $$V_{oT}=A_o e^{j(\omega t+\psi+\Delta\phi A)}[B_A+B_B e^{-j\pi/2}]$$

which may be simplified to:

$$V_{oT}=A_o' B' e^{j\theta}$$

where $B'=(B_A^2+B_B^2)^{\frac{1}{2}}$ and $\tan\theta=B_B/B_A$.

Thus, the phase of an input signal $V_i$ (FIG. 15) is shifted in accordance with the ratio of the amplitudes $V_o^{(A)}$, $V_o^{(B)}$ of such input signal as coupled to each drain electrode 536a, 536b which are coupled in quadrature to provide the signal $V_{ot}$ (FIG. 15) at the output of the quadrature coupler 1560.

Thus by selecting the relative values of $B_1$ and $B_2$ any phase between 0 and $\pi/2$ may be realized. Since only the ratio of $B_1$ and $B_2$ determines the phase, it is possible to keep B' and hence the overall gain of the stage 40a" substantially constant. This is accomplished by separately adjusting the values of $B_1$ and $B_2$. This provides an additional flexibility of amplitude control along with phase adjustment.

As an example, for a minimum phase shift increment of $\pi/16$, the values of $B_1$ and $B_2$ which will yield all eight phase shift increments between 0 and $\pi/2$ with substantially constant amplitude B' are given in the Table below.

TABLE

| Phase Shift | $b_1$ | $b_2$ |
|---|---|---|
| 0 | 1.000 | 0 |
| $\pi/16$ | 0.981 | 0.195 |
| $\pi/8$ | 0.924 | 0.383 |
| $3\pi/16$ | 0.832 | 0.556 |
| $\pi/4$ | 0.707 | 0.707 |
| $5\pi/16$ | 0.556 | 0.832 |
| $3\pi/8$ | 0.383 | 0.924 |
| $7\pi/16$ | 0.195 | 0.981 |
| $\pi/2$ | 0 | 1.000 |

where:
$b_1B' = B_1$
$b_2B' = B_2$

The minimal phase shift increment provided by the variable phase shift stage 40a" is limited only by the degree of control of the voltage applied to the control gate electrodes 534a–534b of FET 530a–530b of phase shifter stage 40a".

Phase shift stage 40a" is cascade interconnected to phase shift stage 40b", as shown. The phase shift stage 40b" is identical to phase shift stage 40a". The only difference between the stages 40a" and 40b", is the technique for producing the phase shift. A phase shift of 0° or 90° provided by phase shifter stage 40b" is determined by controlling which FET 530a–530b is biased in the on state, as previously described in conjunction with FIGS. 6–8.

Phase shift 40c" stage is similar to phase shift stage 40a" except for the inclusion of an additional 90° of pathlength difference such as transmission line section 554b (FIG. 9b) coupled between the impedance matching network 545a and the coupler 1560.

Figure 18:
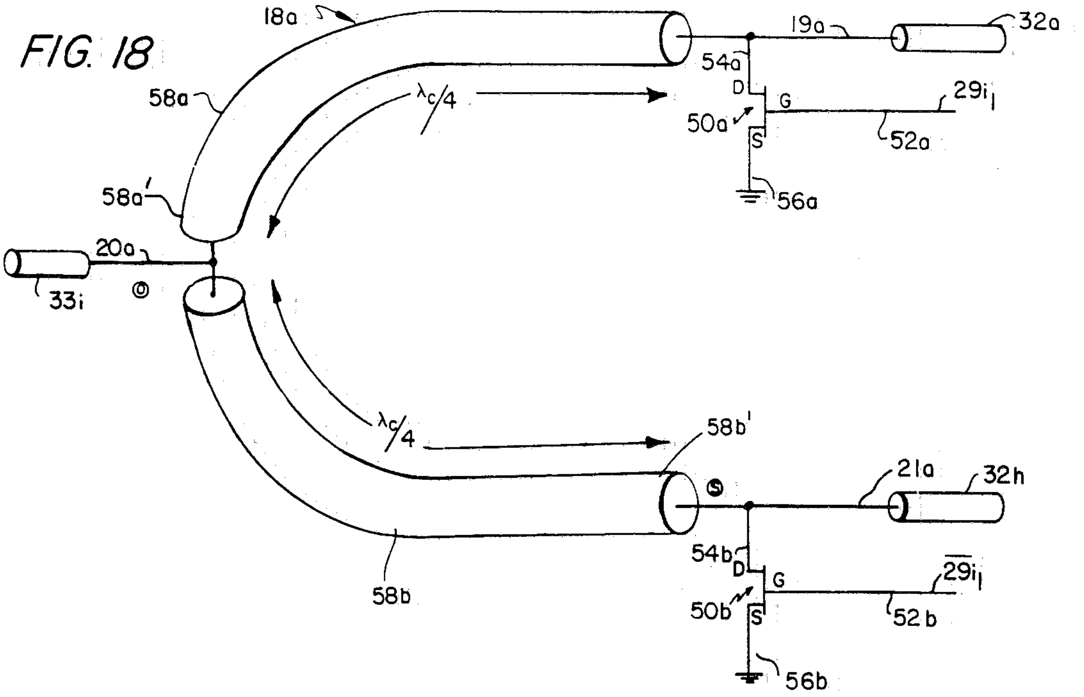
FIG. 18 is a diagrammatical view of a bidirectional three port switch.
Figure 19:
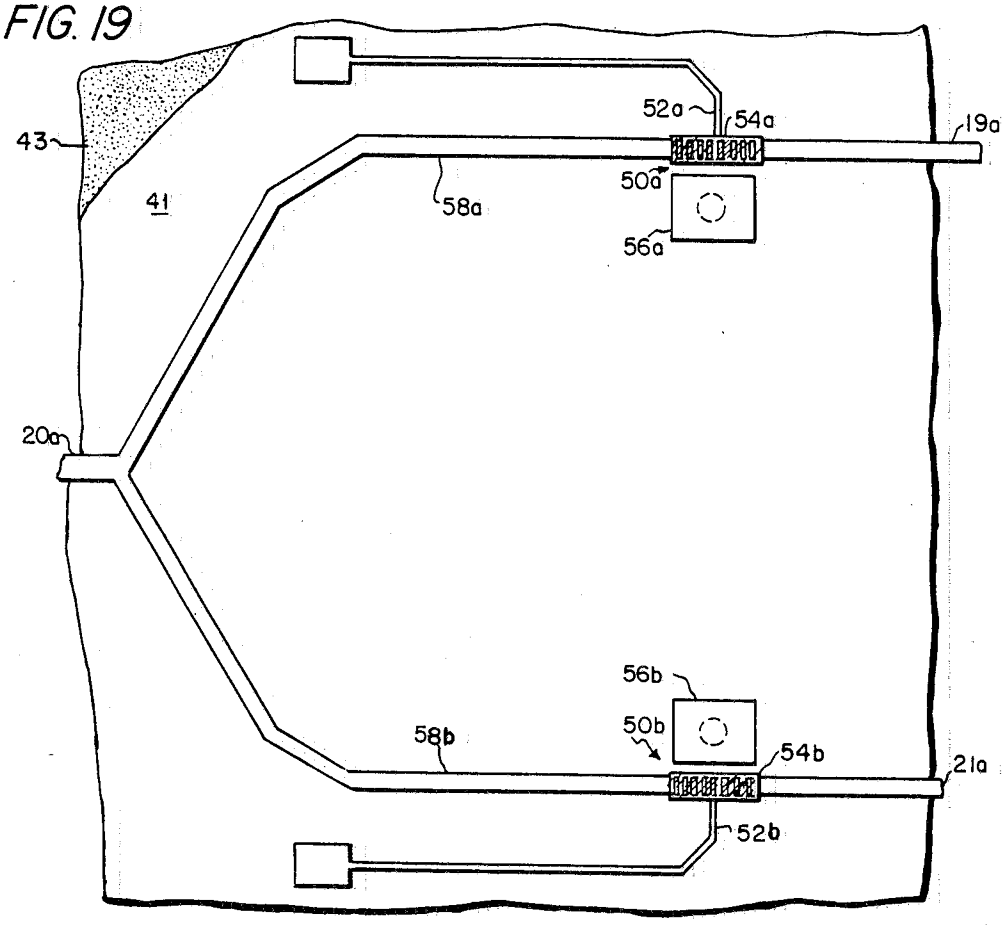
FIG. 19 is a schematic diagram of the bidirectional switch shown in FIG. 18.
Figure 20:
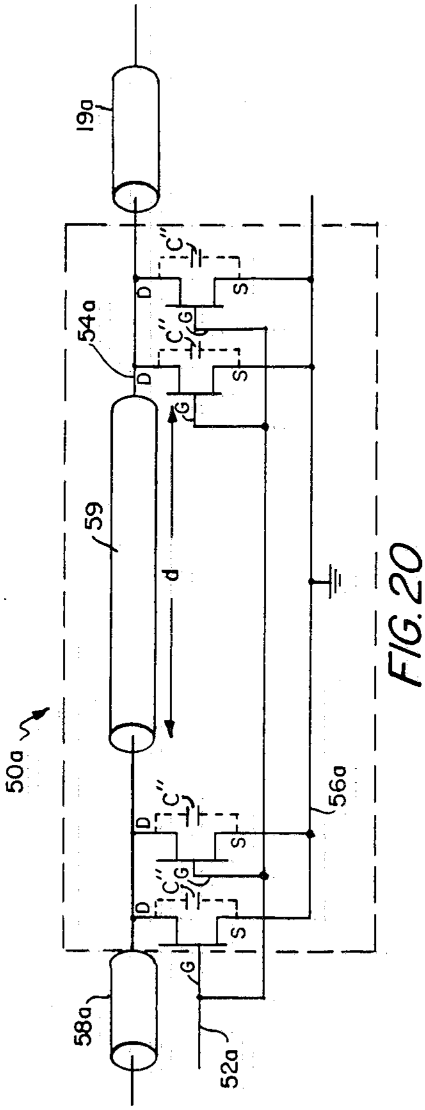
FIG. 20 is a schematic diagram of a preferred field effect transistor FET used in the bidirectional switch of FIG. 18.

Referring now to FIGS. 18–19, bidirectional switch 18a having a first branch port 19a coupled to transmission line 32a (FIG. 2), a second branch port 21a, coupled to transmission line 32h (FIG. 2), and a common port 20a coupled to transmission line 33i, (FIG. 2), is shown. The bidirectional switch 18a is formed on the substrate 41, having the ground plane 43 formed on the bottom surface of substrate 41, as shown. FETs 50a–50b are formed on a portion of the substrate 41. In the preferred embodiment, FET's 50a, 50b include a plurality of FET cells, each cell having a reactive component (C") coupled between the drain and source electrode of each cell as shown in FIG. 20. A network, here the FET 50a is formed interconnecting each one of such drain electrodes of each FET cell. Such network is formed having a characteristic impedance equal to the characteristic impedance of the transmission line sections 58a, 58b, here 50 ohms. The network is formed as follows: a length (d) of a microstrip conductor 59 having a distributed inductance per unit length ($L_L$) and a distributed capacitance per unit length ($C_L$) is chosen such that when coupled between the cells of each FET will provide such network with the predetermined characteristic impedance given as: $Z_o=(L_L(C_L+2(C''/d)))^{\frac{1}{2}}$. The bidirectional switch further includes a pair of transmission lines 58a–58b, each having a electrical length substantially equal to one quarter of a wavelength ($\lambda_c/4$) where $\lambda_c$ is the wavelength of the nominal operating frequency for the circuit. The first drain electrode 54a of FET 50a is coupled between the first branch port 19a and to one end of transmission line 58a. The transmission line 58a is coupled between the branch port 19a and the common port 20a. A drain electrode 54b of a second FET 50b is coupled to the second branch port 21a, and one end of the transmission line 58b. The other end of transmission line 58b is coupled to the common port 20a. The sources 56a–56b of FET 50a–50b are electrically connected to ground. The gate electrodes 52a–52b of FET's 50a–50b are electrically connected to control lines $29_{i1}$, $\overline{29}_{i1}$, which fed complementary signals on such lines.

The T/R switch 18a is used to couple a signal on transmission line 33i of the transceiver 12i (FIG. 2) fed to the common port 20a to one of the branch ports 19a or 21a in accordance with a pair of complementary control signals on lines $29i_1$, $\overline{29}i_1$, fed to gate electrodes 52a, 52b. The T/R switch 18a couples an input signal from common port 20a to branch port 19a, as follows: the control signal on line $29i_1$, is fed to the gate electrode 52a of FET 50a, placing FET 50a in a nonconducting state; correspondingly, the control signal fed on line $\overline{29}i_1$ is applied to the gate electrode 52b of FET 50b placing FET 50b in a conducting state; by placing FET 50b in a conducting state, a short circuit Ⓢ (low impedance path to ground) is produced at the end 58b' of transmission line 58b coupled to the drain electrode 54b; one quarter of a wavelength from this point (at the second end of transmission line 58b) the short circuit at the first end appears as an open circuit Ⓞ (high impedance) to a microwave frequency signal having a wavelength substantially similar to the wavelength of the corresponding centerband frequency of operation for the bidirectional switch 18a. The transmission line 58a and the open circuit resulting from FET 50a being in a nonconducting state, appears as a 50 ohm transmission line at the common port side 58a' of the transmission line 58a. Thus, a signal on common port 20a is coupled to the branch port 19a. In a similar manner, by changing the state of the complementary pair of control signals on lines $29i_1$, $\overline{29}i_1$, a microwave frequency signal on common port 20*a* may be coupled to the branch port 21*a*.

Having described preferred embodiments of the invention, it will now become readily apparent to those of skill in the art that other embodiments incorporating the concepts of the invention may be realized. It is felt, therefore, that this invention should not be limited to the disclosed embodiments but rather should be limited only to the spirit and scope of the appended claims.

What is claimed is:

1. A phase shifter comprising:

a plurality of transistors, each transistor including a control electrode fed by a control signal, an input electrode, a reference electrode connected to a reference potential with said control signal having a voltage level with respect to said reference potential, and an output electrode;

a plurality of transmission lines, each one of said lines having a predetermined electrical pathlength and being electrically coupled between a first one of the input and output electrodes of a corresponding one of the plurality of transistors, and a corresponding one of input and output ports of the phase shifter, to provide an output signal having a predetermined voltage level with respect to the reference potential and having a predetermined phase shift relative to an input signal fed to the input port, said input signal having a predetermined voltage level with respect to said reference potential with said phase shift being related to the predetermined electrical pathlength of a selected one of said transmission lines, with said selected transmission line being selected in accordance with the voltage level of the control signal applied to the control electrode of each transistor.

2. The phase shifter as recited in claim 1 wherein the phase shifter provides gain to the output signal.

3. A phase shifter comprising:

a substrate;

a plurality of field effect transistors formed on the substrate, each transistor including a first control electrode fed by one of a plurality of control signals, a second control electrode fed by an input signal, and an output electrode; and a coupling means, formed on the substrate, electrically coupling the output electrode of each field effect transistor to an output port, for producing in response to the control signals an output signal having a predetermined phase shift relative to an input signal fed to the input port.

4. A phase shifter as recited in claim 3 wherein the coupling means includes a microwave transmission line formed on the substrate.

5. A phase shifter as recited in claim 3 wherein the coupling means further comprises a plurality of microwave transmission lines, each of such microwave transmission lines having a first end being electrically connected to a corresponding one of the output electrodes of the plurality of transistors and a second and electrically connected to the output port.

6. A phase shifter as recited in claim 5 wherein the length of each of such microwave transmission lines is selected to provide an electrical pathlength difference corresponding to a desired phase shift increment.

7. The phase shifter as recited in claim 3 wherein the phase shifter provides gain to the output signal.

8. A phase shifter comprising:

a pair of field effect transistors each one of the field effect transistors including a control gate electrode, an input gate electrode, and a drain electrode;

wherein the input gate electrodes of the pair of field effect transistors are electrically connected to an input signal source, the control gate electrodes of the pair of field effect transistors are fed by control signal; and a pair of transmission lines electrically coupled between the drain electrodes of each field effect transistor and a common junction, to provide a pair of signal paths, each having a predetermined electrical pathlength and for producing an output signal having a predetermined phase shift relative to the input signal, such phase shift being related to the predetermined electrical pathlength of a selected one of said paths, said paths being selected in accordance with the control signals fed to the control gate electrodes of such field effect transistors.

9. A phase shifter as recited in claim 8 wherein the coupling means includes a microwave frequency transmission line.

10. The phase shifter as recited in claim 8 wherein the phase shifter provides gain to the output signal.

11. A phase shifter comprising:

a plurality of field effect transistors each including a first gate electrode, a second gate electrode, and a drain electrode;

wherein the first gate electrode of each field effect transistor is electrically connected to a common input signal source, the second gate electrode of each field effect transistor is fed by a control signal; and a coupling means electrically cascade interconnecting the drain electrode of each field effect transistor for providing a predetermined electrical pathlength between each one of the drain electrodes and for producing in response to the control signals, an output signal at an output port having a predetermined phase shift related to the sum of the electrical pathlengths between a selected one of said drain electrodes and an output port.

12. The phase shifter as recited in claim 11 wherein the selected drain electrode is determined by the control signal fed to the second gate electrode of each FET.

13. A digitally controlled phase shifter, having an input port, an output port, and a control port, for providing a signal at the output port having a phase shifted a predetermined amount relative to the phase of a signal applied to the input port, comprising:

a plurality of phase shift stages, each one of such stages having an input terminal and output terminal and being cascade interconnected to a corresponding one of input and output terminals of a succeeding stage between the input port and the output port; and wherein each stage comprises:

a pair of transistors, each transistor comprising an input electrode, a control electrode, a reference electrode connected to a reference potential, and an output electrode; and a coupling means, electrically coupled between a first one of the input and output electrodes of the transistor and a corresponding one of input and output terminals of the stage, for providing an incremental phase shift to a signal applied thereto, selectively in accordance with a pair of complementary control signals fed to the control electrode of each one of the transistors, with said signals having predetermined voltage levels with respect to said reference potential.

14. The digitally controlled phase shifter as recited in claim 13 wherein each stage of the digitally controlled phase shifter provides gain to the output signal.

15. The digitally controlled phase shifter as recited in claim 13 wherein the digitally controlled phase shifter provides gain to the output signal.

16. A phase shifter for producing an output signal having one of a plurality of predetermined discrete phase shifts relative to an input signal selectively in accordance with a corresponding one of a plurality of control signals comprising:

a plurality of transistors, each transistor including a first control electrode fed by one of said control signals, a second control electrode fed by the input signal, a reference electrode connected to a reference potential, and an output electrode; and a plurality of transmission lines with a corresponding one of each of such lines being electrically coupled between a first one of the input and output electrodes of a corresponding one of the plurality of transistors and to a corresponding first one of input and output ports of the phase shifter, each one of said transmission lines having an electrical length corresponding to a corresponding one of the plurality of discrete phase shifts for producing,in response to the control signals, the output signal having one of the predetermined phase shifts.

17. The phase shifter as recited in claim 16 wherein the phase shifter provides a predetermined amount of gain to the output signal.

18. A phase shifter for producing an output signal having one of a plurality of predetermined discrete phase shifts relative to an input signal selectively in accordance with a corresponding one of a plurality of control signals comprising:

a substrate;

a plurality of field effect transistors formed on the substrate, each transistor including a first control electrode fed by one of said control signals, a second control electrode fed by the input signal, and an output electrode; and a plurality of transmission lines, formed on the substrate, with a corresponding one of each of such lines being electrically coupled between the output electrode of each field effect transistor and an output port of the phase shifter each one of said transmission lines having an electrical length corresponding to a corresponding one of the plurality of discrete phase shifts for producing in response to the control signals the output signal having one of the predetermined discrete phase shifts.

19. A phase shifter as recited in claim 18 wherein the transmission lines formed on the substrate are microstrip transmission lines having a strip conductor portion formed on the substrate and dielectrically spaced by the substrate from a ground plane conductor.

20. The phase shifter as recited in claim 18 wherein the phase shifter provides a predetermined amount of gain to the output signal.

21. A phase shifter for producing an output signal having one of a pair of predetermined discrete phase shifts relative to an input signal selectively in accordance with a corresponding one of a pair of control signals comprising:

a pair of field effect transistors each one of the field effect transistors including a control gate electrode fed by one of said control signals, an input gate electrode fed by the input signal, and a drain electrode; and a pair of transmission lines electrically coupled between the drain electrodes of each field effect transistor and a common junction, each one having an electrical length equal to a corresponding one of the pair of predetermined discrete phase shifts for producing the outut signal having one of the predetermined phase shifts, such phase shift being selected in accordance with the control signals fed to the control gate electrode of such field effect transistors.

22. The phase shifter as recited in claim 21 wherein each stage provides a predetermined amount of gain to the output signal.

23. A digitally controlled phase shifter, having an input port, an output port, and being adapted to be fed by a plurality of pairs of complementary control signals, for providing an output signal at the output port having a phase shifted a predetermined amount relative to the phase of an input signal applied to the input port, comprising:

a plurality of phase shift stages, each one of such stages being cascade interconnected to a succeeding stage between the input port and the output port, each stage providing a selected one of a pair of discrete phase shifts and a predetermined gain to a signal propagating therethrough in response to a corresponding one of the plurality of pairs of complementary control signals with the phase shift of the output signal at the output port of the digitally controlled phase shifter being a combination of the individual selected discrete phase shifts of each stage and the gain of said output signal relative to said input signal is a combination of the gain provided by each one of said stages; and wherein each stage comprises:

a pair of transistors, each transistor including a first control electrode fed by one of said control signals, a second control electrode fed by the input signal, a reference electrode connected to a reference potential, and an output electrode; and a pair of transmission lines electrically coupled between a first one of the input and output electrodes of the transistor and a corresponding first one of the input and output ports of such stage, each having an electrical pathlength selected in accordance with a corresponding one of the pair of discrete phase shifts.

24. The phase shifter as recited in claim 23 wherein the length of each one of such transmission lines is selected to provide an electrical pathlength difference corresponding to a predetermined phase shift increment.

* * * * *